(12) United States Patent
Huynh

(10) Patent No.: US 8,898,491 B2
(45) Date of Patent: Nov. 25, 2014

(54) POWER MANAGEMENT IC HAVING A POWER SUPPLY PWM THAT IS CONTROLLABLE USING EITHER AN ANALOG OR A DIGITAL FEEDBACK PATH

(75) Inventor: Steven Huynh, Fremont, CA (US)

(73) Assignee: Active-Semi, Inc. (VG)

(*) Notice: Subject to any disclaimer, the term of this patent is extended or adjusted under 35 U.S.C. 154(b) by 465 days.

(21) Appl. No.: 13/461,210

(22) Filed: May 1, 2012

(65) Prior Publication Data

US 2013/0151871 A1 Jun. 13, 2013

Related U.S. Application Data

(63) Continuation-in-part of application No. 13/315,282, filed on Dec. 8, 2011.

(51) Int. Cl.
*G06F 1/24* (2006.01)
*G06F 15/177* (2006.01)

(52) U.S. Cl.
USPC .......... 713/300; 713/1; 713/2; 713/100; 375/238; 370/212

(58) Field of Classification Search
USPC .......... 713/1, 2, 100, 300; 375/238; 370/212
See application file for complete search history.

(56) References Cited

U.S. PATENT DOCUMENTS

| 7,072,779 | B2 | 7/2006 | Hancock et al. | 702/60 |
| 7,581,198 | B2 | 8/2009 | Huynh et al. | 716/1 |
| 7,904,864 | B2 | 3/2011 | Huynh et al. | 716/122 |
| 8,161,450 | B2 | 4/2012 | Huynh et al. | 323/282 |
| 2003/0093702 | A1 | 5/2003 | Luo et al. | 713/320 |
| 2009/0138732 | A1 | 5/2009 | Chang | 713/300 |
| 2010/0127738 | A1 | 5/2010 | Takeuchi | 327/143 |
| 2010/0188133 | A1 | 7/2010 | Burdett | 327/365 |
| 2010/0199247 | A1 | 8/2010 | Huynh et al. | 716/8 |
| 2011/0181260 | A1 | 7/2011 | Kurokawa | 323/282 |

FOREIGN PATENT DOCUMENTS

KR 1020100134714 3/2008

OTHER PUBLICATIONS

International Search Report and Written Opinion by the Korean Intellectual Property Office (KIPO) as international searching authority (ISA) in the related international application PCT/US12/068247 dated Mar. 25, 2013 (12 pages).
"PsoC Programmable System-on-Chip" in Cypress Perform, Cypress Semiconductor Corporation, San Jose, Calif., Doc. No. 001-05356 Rev. Jun. 13, 2011 (47 pages).

*Primary Examiner* — Michael J Brown
(74) *Attorney, Agent, or Firm* — Imperium Patent Works; T. Lester Wallace

(57) ABSTRACT

A Power Management Integrated Circuit (PMIC) includes a pulse width modulator and driver circuit (PWMDC), a processor, and high-side and low-side driver circuitry. The PWMDC, along with components external to the PMIC, forms a switching power supply. A small linear regulator powers the PWMDC from power received via a terminal. The power supply supplies power to other on-chip circuitry, including the driver circuitry and processor. The PWMDC starts an on pulse (of a power supply switching cycle) in response to a clock signal. In a first mode, the PWMDC stops the on pulse based on a signal received from a terminal via an analog feedback signal path. In a second mode, the PWMDC stops the on pulse based on a signal received via a digital feedback signal path. In one example, the digital feedback signal path extends from a terminal, through an ADC, processor, and DAC, to an error node.

24 Claims, 24 Drawing Sheets

MTPMIC DEVELOPMENT SYSTEM

MTPMIC INTEGRATED CIRCUIT

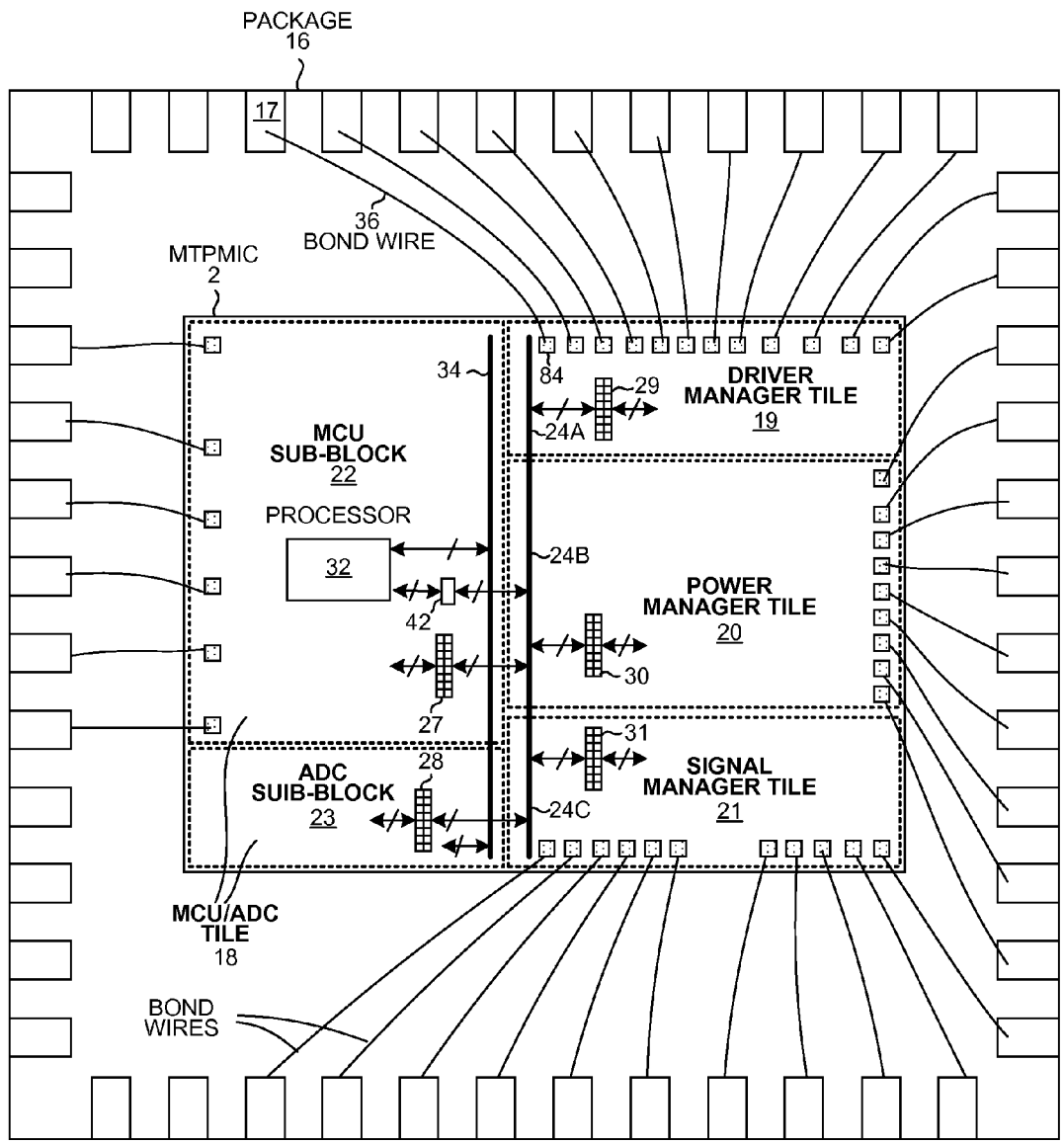
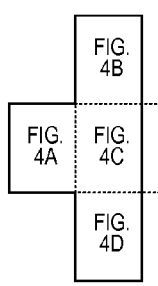
MTPMIC INTEGRATED CIRCUIT
FIG. 3

HIGH VOLTAGE STEP DOWN

FLYBACK

LED DRIVE TOPOLOGY WITH HIGH-
SIDE AND LOW-SIDE DRIVERS

H-BRIDGE INVERTER FOR BACKUP UPS

WIRELES CHARGER

| MCU/ADC TILE CONFIGURATION | | |
|---|---|---|
| CONFIGURATION BIT | VALUE | DESCRIPTION |
| TIMERINA<5:0> | 00h to 3Fh | TIMER INPUT MUX CONTROL (TIMER A) |
| TIMERINB<5:0> | 00h to 3Fh | TIMER INPUT MUX CONTROL (TIMER B) |
| TIMERINC<5:0> | 00h to 3Fh | TIMER INPUT MUX CONTROL (TIMER C) |
| INT1<2:0> | 0h to 7h | INTERRUPT 1 CONTROL INPUT MUX |
| INT2<2:0> | 0h to 7h | INTERRUPT 2 CONTROL INPUT MUX |
| INT3<2:0> | 0h to 7h | INTERRUPT 3 CONTROL INPUT MUX |
| GPIO1.CTL<1:0> | 0h to 3h | GPIO CONTROL FOR GPIO 1 TERMINAL |
| GPIO2.CTL<1:0> | 0h to 3h | GPIO CONTROL FOR GPIO 2 TERMINAL |
| GPIO3.CTL<1:0> | 0h to 3h | GPIO CONTROL FOR GPIO 3 TERMINAL |
| GPIO4.CTL<1:0> | 0h to 3h | GPIO CONTROL FOR GPIO 4 TERMINAL |
| GPIO5.CTL<1:0> | 0h to 3h | GPIO CONTROL FOR GPIO 5 TERMINAL |
| GPIO6.CTL<1:0> | 0h to 3h | GPIO CONTROL FOR GPIO 6 TERMINAL |
| GPIO7.CTL<1:0> | 0h to 3h | GPIO CONTROL FOR GPIO 7 TERMINAL |
| GPIO8.CTL<1:0> | 0h to 3h | GPIO CONTROL FOR GPIO 8 TERMINAL |

CONFIGURATION REGISTER BITS OF MCU/ADC TILE

FIG. 12

| DRIVER MANAGER TILE CONFIGURATION | | |
|---|---|---|
| CONFIGURATION BIT | VALUE | DESCRIPTION |
| FAULTPROT<3:0> | 0h to Fh | FAULT PROTECTION CONTROL |
| DL0.LUT<7:0> | 00h to FFh | LOOKUP TABLE FOR DL0 |
| DL0.DINMUX<17:0> | 00000h to 3FFFFh | DIN MUX CONTROL FOR DL0 |
| DL0.LOGIC<2:0> | 0h to 7h | LOGIC CONTROL FOR DL0 |
| DL0.SEL<1:0> | 0h to 3h | DRIVER SIGNAL SELECT FOR DL0 |
| DL0.STRENGTH | 0 or 1 | DRIVER STRENGTH ADJUSTMENT FOR DL0 |
| DL1.LUT<7:0> | 00h to FFh | LOOKUP TABLE FOR DL1 |
| DL1.DINMUX<17:0> | 00000h to 3FFFFh | DIN MUX CONTROL FOR DL1 |
| DL1.LOGIC<2:0> | 0h to 7h | LOGIC CONTROL FOR DL1 |
| DL1.SEL<1:0> | 0h to 3h | DRIVER SIGNAL SELECT FOR DL1 |
| DL1.STRENGTH | 0 or 1 | DRIVER STRENGTH ADJUSTMENT FOR DL1 |
| DL2.LUT<7:0> | 00h to FFh | LOOKUP TABLE FOR DL2 |
| DL2.DINMUX<17:0> | 00000h to 3FFFFh | DIN MUX CONTROL FOR DL2 |
| DL2.LOGIC<2:0> | 0h to 7h | LOGIC CONTROL FOR DL2 |
| DL2.SEL<1:0> | 0h to 3h | DRIVER SIGNAL SELECT FOR DL2 |
| DL2.STRENGTH | 0 or 1 | DRIVER STRENGTH ADJUSTMENT FOR DL2 |
| DH0.LUT<7:0> | 00h to FFh | LOOKUP TABLE FOR DH0 |
| DH0.DINMUX<17:0> | 00000h to 3FFFFh | DIN MUX CONTROL FOR DH0 |
| DH0.LOGIC<2:0> | 0h to 7h | LOGIC CONTROL FOR DH0 |
| DH0.SEL<1:0> | 0h to 3h | DRIVER SIGNAL SELECT FOR DH0 |
| DH0.STRENGTH | 0 or 1 | DRIVER STRENGTH ADJUSTMENT FOR DH0 |
| DH1.LUT<7:0> | 00h to FFh | LOOKUP TABLE FOR DH1 |
| DH1.DINMUX<17:0> | 00000h to 3FFFFh | DIN MUX CONTROL FOR DH1 |
| DH1.LOGIC<2:0> | 0h to 7h | LOGIC CONTROL FOR DH1 |
| DH1.SEL<1:0> | 0h to 3h | DRIVER SIGNAL SELECT FOR DH1 |
| DH1.STRENGTH | 0 or 1 | DRIVER STRENGTH ADJUSTMENT FOR DH1 |
| DH2.LUT<7:0> | 00h to FFh | LOOKUP TABLE FOR DH2 |
| DH2.DINMUX<17:0> | 00000h to 3FFFFh | DIN MUX CONTROL FOR DH2 |
| DH2.LOGIC<2:0> | 0h to 7h | LOGIC CONTROL FOR DH2 |
| DH2.SEL<1:0> | 0h to 3h | DRIVER SIGNAL SELECT FOR DH2 |
| DH2.STRENGTH | 0 or 1 | DRIVER STRENGTH ADJUSTMENT FOR DH2 |

CONFIGURATION REGISTER BITS OF DRIVER MANAGER TILE

FIG. 13

| POWER MANAGER TILE CONFIGURATION | | |
|---|---|---|
| CONFIGURATION BIT | VALUE | DESCRIPTION |
| FB<1:0> | 00b to 11b | FEEDBACK VOLTAGE SETTING |
| ERROR AMP | 0 | 1 uS |
| TRANSCONDUCTANCE | 1 | 4 uS |
| PULSEDDRIVE | 0 | DISABLE PULL-DOWN PULSED DRIVE |
| | 1 | ENABLE PULL-DOWN PULSED DRIVE |
| CLKDIV<2:0> | 000b to 111b | CLOCK FREQUENCY DIVISION SETTING |
| IMODDAC<7:0> | 00h to FFh | CURRENT MODULATION TO IMOD DAC |

CONFIGURATION REGISTER BITS OF POWER MANAGER TILE

FIG. 14

| SIGNAL MANAGER TILE CONFIGURATION | | |
|---|---|---|
| CONFIGURATION BIT | VALUE | DESCRIPTION |
| IOCTL<19:0> | 00000h to FFFFFh | I/O CONTROL CONFIGURATION FOR AIO0..AIO9 |
| GAIN54<3:0> | 0h to Fh | DIFF AMPLIFIER GAIN FOR (AIO5, AIO4) INPUTS |
| GAIN32<3:0> | 0h to Fh | DIFF AMPLIFIER GAIN FOR (AIO3, AIO2) INPUTS |
| GAIN10<3:0> | 0h to Fh | DIFF AMPLIFIER GAIN FOR (AIO1, AIO0) INPUTS |
| DAC<9:0> | 000h to 3FFh | DAC VOLTAGE |
| PROT54 | 0 | DISABLE PROTECTION BASED ON (AIO5, AIO4) INPUTS |
| | 1 | ENABLE PROTECTION BASED ON (AIO5, AIO4) INPUTS |
| PROT32 | 0 | DISABLE PROTECTION BASED ON (AIO3, AIO2) INPUTS |
| | 1 | ENABLE PROTECTION BASED ON (AIO3, AIO2) INPUTS |
| PROT10 | 0 | DISABLE PROTECTION BASED ON (AIO1, AIO0) INPUTS |
| | 1 | ENABLE PROTECTION BASED ON (AIO1, AIO0) INPUTS |
| BIDIRMUX<3:0> | 0h to 5h | BIDIRECTION MUX CONTROL |
| ADEMUX<1:0> | 0h to 2h | ANALOG 1:3 DEMUX CONTROL |
| VTH<1:0> | 0h to 3h | EVENT COMPARATOR THRESHOLD SELECT |
| AIO6.EVENT<11:0> | 000h to FFFh | EVENT CONTROL FOR AIO6 TERMINAL |
| AIO7.EVENT<11:0> | 000h to FFFh | EVENT CONTROL FOR AIO7 TERMINAL |
| AIO8.EVENT<11:0> | 000h to FFFh | EVENT CONTROL FOR AIO8 TERMINAL |
| AIO9.EVENT<11:0> | 000h to FFFh | EVENT CONTROL FOR AIO9 TERMINAL |

CONFIGURATION REGISTER BITS OF SIGNAL MANAGER TILE

FIG. 15

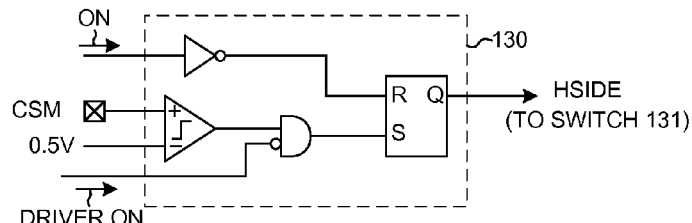

FIG. 16

POWER MANAGEMENT IC HAVING A POWER SUPPLY PWM THAT IS CONTROLLABLE USING EITHER AN ANALOG OR A DIGITAL FEEDBACK PATH

CROSS REFERENCE TO RELATED APPLICATION

This application is a continuation-in-part of, and claims priority under 35 U.S.C. §120 from, nonprovisional U.S. patent application Ser. No. 13/315,282 entitled "Power Manager Tile For Multi-Tile Power Management Integrated Circuit," filed on Dec. 8, 2011, the subject matter of which is incorporated herein by reference.

TECHNICAL FIELD

The present disclosure relates generally to power management integrated circuits.

BACKGROUND INFORMATION

There are a many varieties of microcontroller integrated circuits that are useable in power switching and power control applications. Existing microcontrollers typically involve a processor along with relatively simple general purpose input/output terminals and perhaps an Analog-to-Digital Converter (ADC) and/or a Digital-to-Analog Converter (DAC). To use such a microcontroller in the overall power control system, some sort of power supply is generally necessary to generate a supply voltage from which power can then be used or switched under control of the microcontroller. The circuitry of the microcontroller itself also must be powered from a DC supply voltage. Often the DC supply voltage from which the microcontroller is to be powered is of a different voltage than is the supply voltage needed by other parts of the system. Design of a power supply or power supplies is therefore often part of the task of designing the overall microcontroller controlled system. The power supply is to supply power to the overall system as well as to the microcontroller circuitry.

Although engineers with backgrounds in microcontroller programming are generally capable of designing and building simple circuits that can provide power to such a microcontroller if the microcontroller is operating by itself, the skill set of such engineers generally does not include experience designing more complex switching power supplies of the types suitable for supplying power to the overall microcontroller controlled system. The skill set of such engineers also may not include knowledge of how to design the analog power interface circuitry that might be necessary to couple the microcontroller to the system being monitored or controlled. Moreover, the selection of the best microcontroller for the application can be a challenging task. Choosing a particular microcontroller or microcontroller family for use in the design of the system can be a restraining and limiting choice. If the selection of a particular microcontroller family is made, and later changes in function of the system is necessary, then the microcontroller family initially selected may not be able to satisfy the new needs of the evolving system. Time and money invested in learning about a previously selected microcontroller may be wasted if the microcontroller at the heart of the system must be changed. For these reasons and other reasons, designing and developing the overall system is less than trivial task for an average engineer in many instances. Ways to reduce the difficulties associated with designing such a microcontroller based power switching system are desired.

SUMMARY

A Multi-Tile Power Management Integrated Circuit (MTPMIC) includes a plurality of Power Management Integrated Circuit (PMIC) tiles. In one example, these PMIC tiles include an MCU/ADC tile, a driver manager tile, a power manager tile, and a signal manager tile. The PMIC tiles when joined together as parts of the MTPMIC form a standardized bus. Each tile has functional circuitry and a configuration register. Configuration information in the configuration register of a tile determines how the functional circuitry of the tile is configured. A processor in the MCU/ADC tile is coupled to the standardized bus. This processor can write across the standardized bus to the configuration register in any desired one of the tiles and in this way can configure and reconfigure the functional circuitry in the various tiles.

The power manager tile includes a set of configurable pulse width modulator components referred to as the Configurable Switching Power Supply Pulse Width Modulator (CSPSPWM). In addition to the CSPSPWM, the power manager tile includes a high voltage terminal VHM, an internal regulator that supplies power to the CSPSPWM circuitry, a driver output terminal DRM, a driver circuit coupled to receive a signal from the CSPSPWM and coupled to drive a driver output signal onto the driver output terminal DRM, a supply voltage terminal VP that couplable to an error amplifier of the CSPSPWM, a configuration register, and other components. Configuration information stored in the configuration register determines how the CSPSPWM is configured. The power manager tile is configurable in different ways along with a small number of external components (external to the MTPMIC) to realize a selected one of a number of switching power supply circuits such as: a step down converter, a high voltage step down converter, a flyback converter, and a boost converter.

In one novel aspect, terminals of the power manager tile are coupled to external circuitry (external to the MTPMIC integrated circuit) so that the power manager tile and the external circuitry are operable together as a switching power supply. The overall system, including the MTPMIC is initially unpowered. Power from an external source is then applied to the MTPMIC via the high voltage terminal VHM. This application of power may, for example, involve coupling an unregulated DC voltage or through a boot-strap start-up resistor from a high voltage source onto the high voltage terminal VHM. The internal regulator of the CSPSPWM is then powered from this external source and supplies the remaining circuitry of the CSPSPWM with operating power. Once powered by the internal regulator, the CSPSPWM begins operating along with the driver circuit and with the external components as a switching power supply.

During switching of the switching power supply, the CSPSPWM causes a main switch of the switching power supply to be pulsed on in a safe start-up mode. In the safe start-up mode, the main switch is pulsed on at a constant fixed low switching frequency and with pulses that have a fixed on time. As the switching power supply operates in this safe mode, the supply voltage VP on the terminal VP rises. During this time, the CSPSPWM determines the current sensing method based on how circuitry external to the integrated circuit is configured and operates. The supply voltage VP on the terminal VP is the output supply voltage of the switching power supply. After a short time of operation in the safe mode, the supply voltage VP present on the terminal VP is high enough that the CSPSPWM is made to operate in a normal operating mode. In the normal operating mode, the main external switch is controlled to switch at a higher switching frequency (higher than in the start-up mode) and with pulse width modulated on time.

The supply voltage VP is then used by linear regulator circuitry within the power manager tile to generate a supply voltage VCORE. This supply voltage VCORE is supplied via a conductor of the standardized bus to the processor in the MCU/ADC tile. As a result, the processor is powered up and begins executing instructions. In one example, execution of the instructions causes the processor to write across the standardized bus to the configuration register in the power manager tile. In the case of a high voltage power source, the supply voltage VP is also used to replenish the VHM voltage through an external diode after the VP voltage rises past the VHM voltage.

In a power switching application, drivers in the driver manager tile are coupled to control external power circuitry, and input circuits such as differential amplifiers and signal event generators in the signal manager tile are coupled to detect and to monitor operation of the external power circuitry. The processor receives information about operation of the external power circuitry from the signal manager tile, processes the information, and in response controls the drivers in the driver manager tile to control the external power circuitry properly in a control loop. Not only is the MTPMIC itself powered by the switching power supply (of which the CSPSPWM of the power manager tile is a part), but also the external power circuitry being controlled is powered by the switching power supply. In one example, the CSPSPWM switches the switching power supply (of which the CSPSPWM and driver are a part) such that the switching power supply supplies at least as much power to the external power circuitry being controlled by the MTPMIC as is consumed by the MTPMIC itself. In one example, at least one watt of power is supplied to the external power circuitry.

In one example, the driver manager tile includes a high-side driver output circuit. The high-side driver output circuit has a level shifter and a driver. The driver couples a high-side output terminal to a voltage present on a second terminal if the high-side output terminal is to be driven to a high level, and that couples the high-side output terminal to a voltage present on a third terminal if the high-side output terminal is to be driven to a low level. In another example, the signal manager tile includes a differential amplifier circuit, where a first input of the differential amplifier circuit is coupled to receive a first signal from a first terminal, and where a second input of the differential amplifier circuit is coupled to receive a second signal from a second terminal. An analog signal output by the differential amplifier can be supplied onto the input lead of an Analog-to-Digital Converter (ADC) in the MCU/ADC tile so that the ADC can digitize the analog signal. In another example, the driver circuit that drives the driver output terminal DRM of the CSPSPWM is configurable to operate in a pulse pull-down mode. In another example, the CSPSPWM includes a current sense detect circuit that determines whether a current sense terminal CSM is coupled in a high-side current sense configuration or in a low-side current sense configuration. In another example, the CSPSPWM has an error amplifier and a Digital-to-Analog Converter (DAC), where the error amplifier controls a voltage on an error node in first mode of operation, and where the DAC controls the voltage on the error node in a second mode of operation. In the second mode of operation, the processor in the MCU/ADC tile controls the voltage on the error amplifier output node by writing a multi-bit digital value across the standardized bus and to the digital inputs of the DAC.

In one novel aspect, a Multi-Tile Power Management Integrated Circuit (MTPMIC) includes a digital processor, a pulse width modulator and driver circuit (PWMDC), a first terminal (CSM), a second terminal (VP), a driver output terminal (DRM), and high-side and low-side driver circuitry. In response to an edge of a clock signal, the PWMDC starts an on pulse by driving a control signal on the driver output terminal DRM to a first voltage level. In one example, the clock signal is generated by an on-chip oscillator that is a part of the PWMDC and that includes no off-chip components.

In a first mode, the PWMDC stops the on pulse by driving the control signal on the driver output terminal DRM to a second voltage level when a first signal on the first terminal CSM has a predetermined relationship with respect to an error signal derived from a second signal on the second terminal VP. A first analog signal path extends from the first terminal CSM and to a first input lead of a comparator. A second analog signal path extends from the second terminal VP, through an error amplifier, and to the error node (a second input lead of the comparator).

In a second mode, the PWMDC stops the on pulse by driving the control signal on the driver output terminal DRM to the second voltage level when the first signal on the first terminal CSM has a predetermined relationship with respect to a multi-bit digital signal received from the digital processor. A digital feedback signal path extends through an ADC, through the digital processor, through a Digital-to-Analog Converter (DAC) of the PWMDC, and to the error node in the PWMDC. When in the second mode, the digital processor operates as part of the digital feedback signal path by repeatedly changing the multi-bit digital value supplied to the DAC. The digital processor controls whether the PWMDC operates in the first mode or in the second mode. The starting of the on pulse causes a power transistor external to the MTPMIC (for example, transistor 302) to be turned on, whereas the stopping of the on pulse causes the power transistor external of the MTPMIC to be turned off. The turning on and off of the external power transistor switches the power supply.

The supply voltage generated by the switching power supply is regulated by an on-chip linear regulator and the resulting regulated supply voltage is used to power the digital processor. The supply voltage generated by the switching power supply is also used to power the high-side and low-side driver circuitry. The PWMDC circuitry, on the other hand, is not powered from the power supply, but rather a second internal regulator regulates a voltage present on another terminal VHM. The regulated supply voltage output by this second internal regulator is then used to power the PWMDC. Terminal VHM may, for example, be coupled to receive an unregulated battery voltage from an external battery.

The foregoing is a summary and thus contains, by necessity, simplifications, generalizations and omissions of detail; consequently is it appreciated that the summary is illustrative only. Still other methods, and structures and details are set forth in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 3 is a simplified diagram of MTPMIC 2 that is coupled by wire bonds to an integrated circuit package.

FIG. 4 is a diagram of MTPMIC 2.

FIG. 5 is a schematic diagram showing a brushless motor controller application of the MTPMIC 2 of FIG. 4.

FIG. 6 is a schematic diagram showing an LED driver application of the MTPMIC 2 of FIG. 4.

FIG. 12 is a table showing the configuration bits of the configuration registers 27 and 28 of the MCU/ADC tile.

FIG. 13 is a table showing the configuration bits of the configuration register 29 of the driver manager tile.

FIG. 14 is a table showing the configuration bits of the configuration register 30 of the power manager tile.

FIG. 15 is a table showing the configuration bits of the configuration register 31 of the signal manager tile.

FIG. 16 is a circuit diagram of the CSM mode detect block 130.

DETAILED DESCRIPTION

Figure 1:
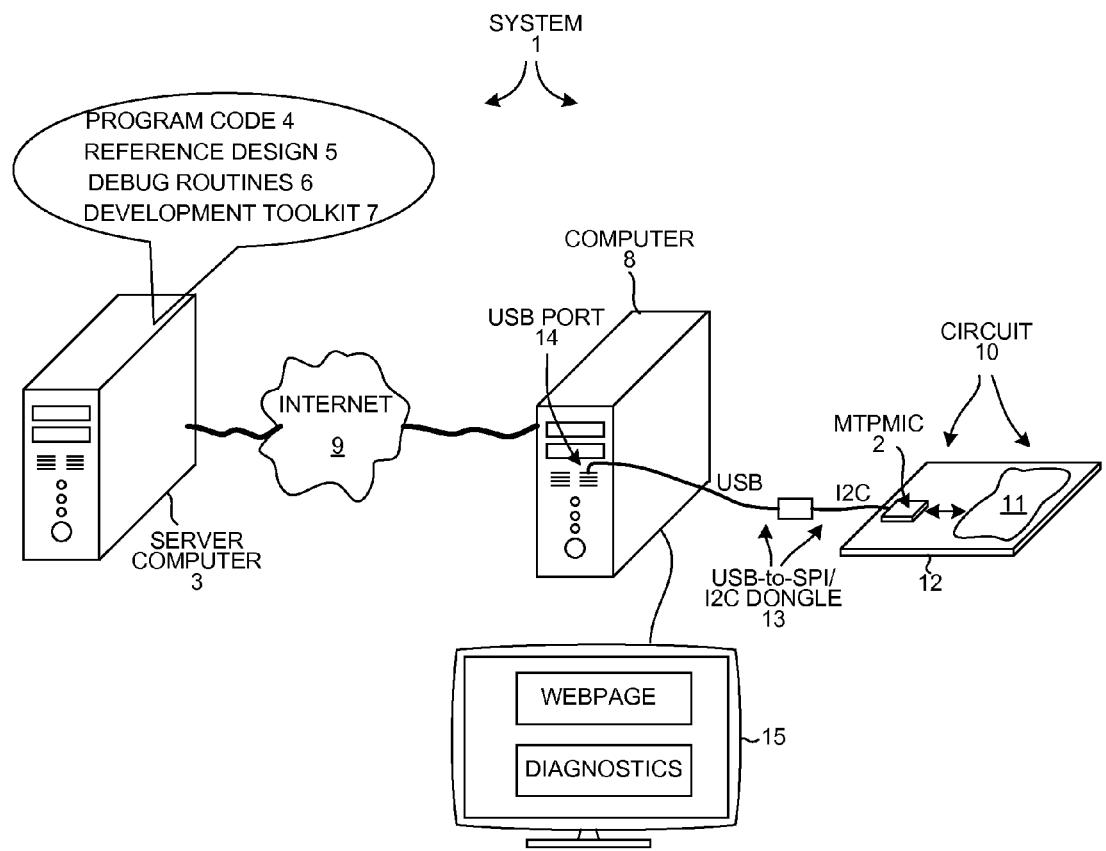
FIG. 1 is a diagram of a system 1 involving a Multi-Tile Power Management Integrated Circuit (MTPMIC) 2.

FIG. 1 is a diagram of a system 1 involving a Multi-Tile Power Management Integrated Circuit (MTPMIC) 2. A server 3 stores an amount of program code 4, information 5 on a reference design that uses the MTPMIC 2, debug routines 6, and development toolkit software 7. Server 3 may store a great number of reference designs using the MTPMIC 2, where each reference design and the associated program code has been thoroughly verified by a power supply company that manufacturers MTPMIC 2 and that operates server 3.

A computer 8 is coupled via the internet 9 to server 3. A user uses computer 8 to access a website served by server 3 and to download from the website the information about MTPMIC 2 and about a reference design. Using this information, the user then fabricates the reference design or another user specific circuit based on the reference design. In the present example, the circuit 10 that the user fabricates is the reference design. The circuit 10 includes MTPMIC 2 and an associated amount of external hardware circuitry 11. Both MTPMIC 2 and the other circuitry 11 are disposed on a Printed Circuit Board (PCB) 12 as illustrated. There is a bidirectional communication link between the circuit 10 and the user's computer 8. In the illustrated example, circuit 10 is coupled via a USB-to-SPI/I2C dongle 13 to the USB port 14 of the user's computer 8. MTPMIC 2 engages in bidirectional communication with the dongle using the SPI or I2C protocol, and the computer 8 engages in bidirectional communication with the dongle using the USB protocol. The USB-to-SPI/I2C dongle 13 functions as a bus protocol translation device.

The user also uses computer 8 to download program code 4 through the internet 9 into computer 8 and then through USB-to-SPI/I2C dongle 13 into MTPMIC 2. In one example, the code 4 is specialized code that is downloaded into program memory in an MCU/ADC tile within the MTPMIC. The MCU/ADC tile includes a processor that can access the memory. The processor executes the downloaded program code 4 and as a result controls MTPMIC 2 and circuitry 11 to function together properly.

In addition, server 3 stores a development toolkit program 7. The user downloads and installs the development toolkit program 7 into computer 8. The user also downloads the debug routines 6 into MTPMIC 2. The development toolkit program 7 executing on computer 8 provides a graphical user interface whereby the user can monitor circuit operation. The debug routines 6 are executed by the processor in the MTPMIC 2 and cause circuitry inside MTPMIC 2 to monitor certain nodes in circuit 10 and to report data on circuit operation back to the toolkit program 7 executing on computer 8. Through this mechanism, the user can interactively disable certain parts of the circuit 10 as desired, and can interactively enable certain parts of the circuit 10. Using the development toolkit, the user can cause the toolkit to log data on currents and voltages at certain nodes in the circuit and to display the logged data on screen 15. The program code 4 may start circuit 10 hardware operating in a safe mode in such a way that the circuit components of the circuit will not damage themselves if the hardware of circuit 10 is improperly assembled. Once circuit 10 has been debugged, the MTPMIC 2 may be reloaded with other code so that MTPMIC 2 operates without the extra debug routines.

Figure 2:
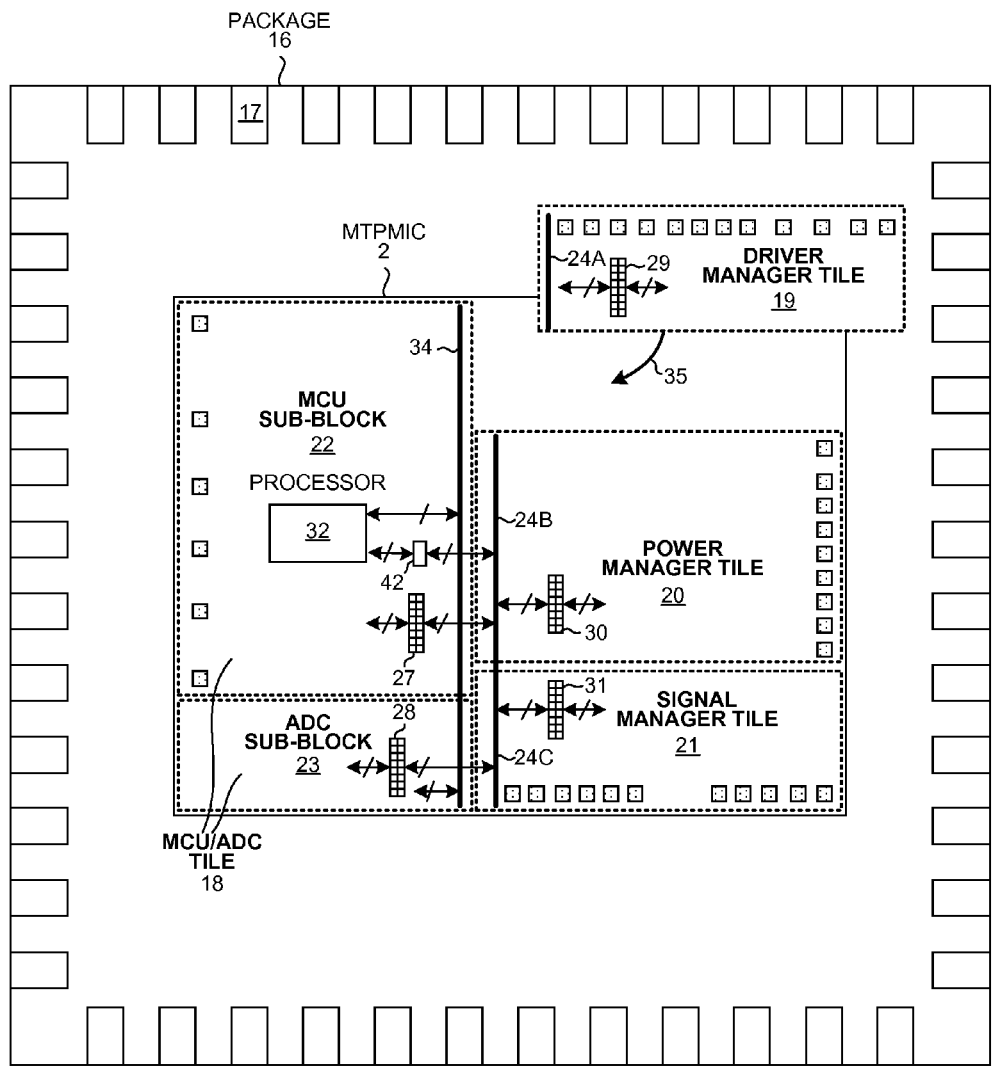
FIG. 2 is a simplified top-down conceptual diagram of MTPMIC 2 illustrating how a PMIC tiles can be easily swapped into, and swapped out of, the MTPMIC during the design of the MTPMIC.

FIG. 2 is a simplified top-down conceptual diagram of MTPMIC 2. MTPMIC 2 is the rectangular integrated circuit die within integrated circuit package 16. Integrated circuit package 16 includes a row of terminals on each on its four sides. One of the terminals at the upper side of the package is identified with reference numeral 17. The MTPMIC 2 itself comprises multiple Power Management Integrated Circuit (PMIC) tile portions. These PMIC portions include the MCU/ADC tile 18, a driver manager tile 19, a power manager tile 20, and a signal manager tile 21. The MCU/ADC tile 18 includes an MCU (microcontroller unit) sub-block 22 and an Analog-to-Digital Converter (ADC) sub-block 23.

Each PMIC tile in the rightmost column has a bus portion of conductors capable of conducting digital signals, analog signals, and power signals. Bus portion 24A is the bus portion of driver manager tile 19. Bus portion 24B is the bus portion of power manager tile 20. Bus portion 24C is the bus portion of signal manager tile 21. The bus portions are disposed within each tile as illustrated so that if the tiles are appropriately arrayed in a column, then the bus portions of adjacent tiles line up with one another and form a standardized bus 24. In the illustrated example, the standardized bus 24 extends vertically along the left edge of the driver manager tile, vertically along the left edge of the power manager tile, and vertically along the left edge of the signal manager tile. The MCU/ADC tile 18 on the left interfaces to this standardized bus 24 in a standardized way using configuration registers 27 and 28. Each of the PMIC tiles in the right column also has such a configuration register coupled to the standardized bus. Configuration register 29 is the configuration register of driver manager tile 19. Configuration register 30 is the configuration register of power manager tile 20. Configuration register 31 is the configuration register of signal manager tile 21.

Each individual bit of each of these configuration registers may include a volatile cell and a non-volatile cell, or may simply involve a volatile cell such as in an ordinary processor-accessible register. If the configuration bit has a non-volatile cell, then on power up of MTPMIC 2 the data content of the non-volatile cell is automatically transferred to the volatile cell, and the data output of the volatile cell is then used to configure other circuitry in the tile. Individual ones of the configurations bits of these configuration registers can be written to, and read from, across the standardized bus.

A processor 32 within MCU/ADC tile 18 is the master of standardized bus 24. Through a bus interface 42, this processor 32 can write to any of the configuration registers in any of the tiles across the standardized bus. For additional information on the tile architecture, the standardized bus, and its associated configuration registers, see: 1) U.S. Pat. No. 7,788,608, entitled "Microbump Function Assignment In A Buck Converter," filed Oct. 29, 2007, by Huynh et al.; 2) U.S. Pat. No. 7,581,198, entitled "Method and System for the Modular Design and Layout of Integrated Circuits," filed Oct. 7, 2006, by Huynh et al.; 3) U.S. provisional application 60/850,359, entitled "Single-Poly EEPROM Structure For Bit-Wise Write/Overwrite," filed Oct. 7, 2006; 4) U.S. Pat. No. 7,869,275, entitled "Memory Structure Capable of Bit-Wise Write or Overwrite," filed Jul. 31, 2007, by Grant et al.; and 5) U.S. Pat. No. 7,904,864, entitled "Interconnect Layer of a Modularly Designed Analog Integrated Circuit," filed Oct. 29, 2007, by Huynh et al; 6) U.S. patent application Ser. No. 11/452,713, entitled "System for a Scaleable and Programmable Power Management Integrated Circuit," filed Jun. 13, 2006, by Huynh; and 7) U.S. provisional application Ser. No. 60/691,721, entitled "System for a Scaleable and Programmable Power Management Integrated Circuit", filed Jun. 16, 2005, by Huynh (the entire subject matter of each of these patent documents is incorporated herein by reference).

In addition to the standardized bus, MTPMIC 2 also includes a processor local bus 34. Various circuits in MCU sub-block 22 and in ADC sub-block 23 are coupled to this processor local bus 34. Processor 32 can read to these various circuits across the processor local bus 34 and processor 32 can also write to these various circuits across the processor local bus 34.

There are many different types of PMIC tiles that are designed to interface to one another using standardized bus 24. At integrated circuit design time, a tile layout for a given one of the PMIC tiles in the right column can be removed and another tile layout for another type of PMIC tile can be substituted. A PMIC tile layout includes layout information for all integrated circuit layers of the tile, including all upper metallization layers. PMIC tiles in the right column can be easily swapped into and out of the integrated circuit being designed so that the resulting MTPMIC integrated circuit will have a desired set of PMIC tiles with desired functionalities. Arrow 35 represents this swapping in of driver manager tile 19 in this design process. In the same way that PMIC tiles in the right column can be swapped in and out at integrated circuit design time, so too can the PMIC tiles in the left column be swapped in and out at integrated circuit design time. Examples of such PMIC tiles in the left column include tiles with communication bus interface circuitry and tiles with additional memory for the processor. An example of a communication bus interface circuit PMIC tile is a tile that has a USB (Universal Serial Bus) controller that couples to processor local bus 34.

FIG. 3 is a simplified diagram of MTPMIC 2. Each terminal of a PMIC tile is coupled via a corresponding wire bond to a corresponding one of the terminals of the package 16. The diagram of FIG. 3 is a simplification. In the actual package, each terminal is part of a leadframe. The leadframe has a finger-portion that extends inward from the terminal toward the integrated circuit. The bond wires are not as long as illustrated in FIG. 3, but rather are shorter and bond not to the actual terminal at the periphery of the package but rather bond the end of the finger-portion associated with the terminal. In the diagram of FIG. 3, reference numeral 36 identifies a bond wire that couples terminal 17 of the package to a terminal (also referred to as a pad) 84 of MTPMIC 2.

FIGS. 4A, 4B, 4C and 4D fit together to form a larger diagram of FIG. 4. A key showing how FIGS. 4A, 4B, 4C and 4D fit together in this way is provided below and to the right of FIG. 3. Standardized bus 24 includes data bus lines DIN[0-7], clock strobe conductors (not shown), uncommitted digital signal conductors (not shown), other committed digital conductors (not shown), uncommitted analog signal conductors AB[0-4], committed analog conductors (not shown), fault conductors FAULT[0-1], global clock conductors (not shown), ground and voltage reference conductors (not shown), as well as other conductors. Processor local bus 34 includes an address bus LOCAL BUS ADR, a data bus LOCAL BUS DATA, and control signal lines LOCAL BUS CTRL. Due to space limitations in the drawings, only some of the conductors of the standardized bus 24 and only some of the conductors of the processor local bus 34 are illustrated.

MCU/ADC Tile

Figure 4A:
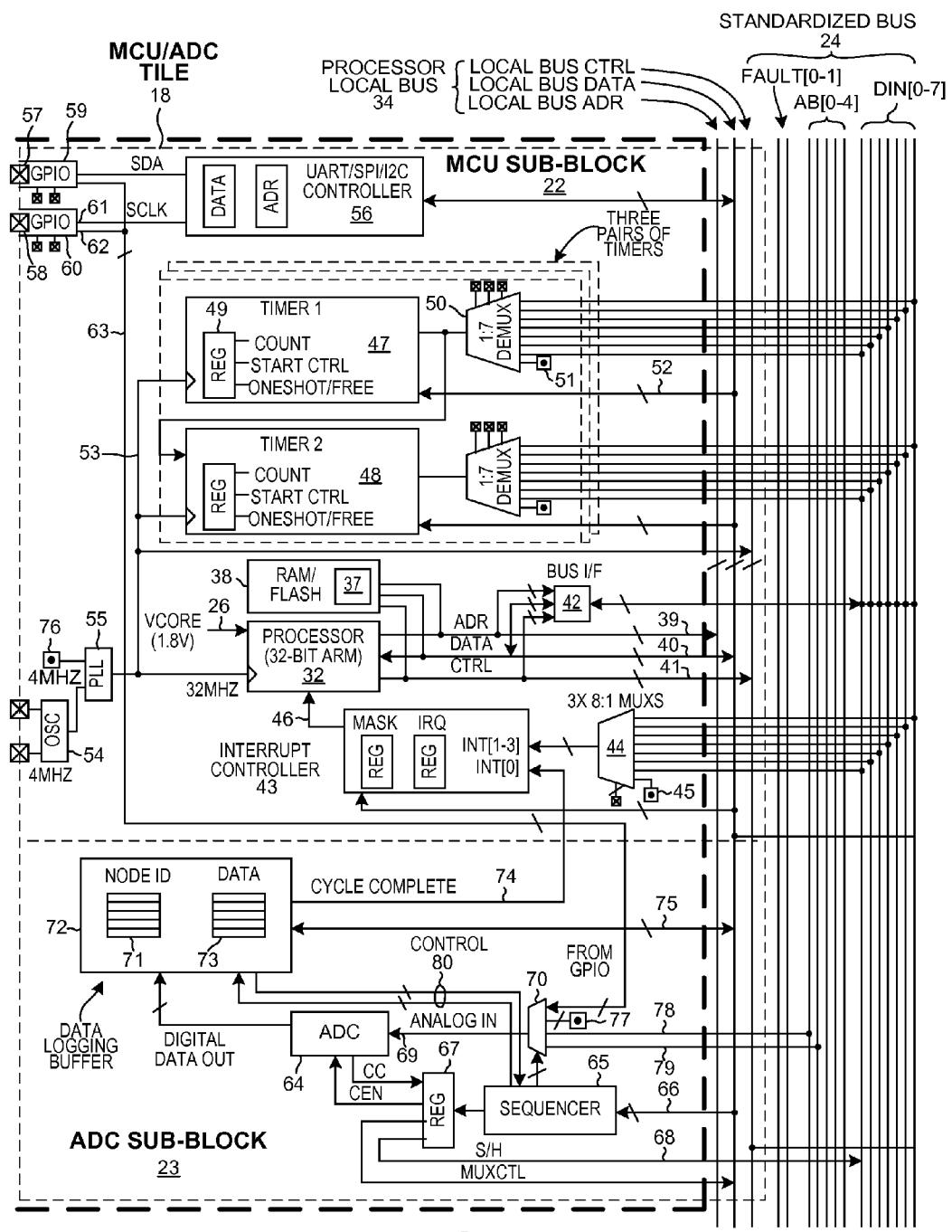
FIGS. 4A, 4B, 4C and 4D fit together to form a larger diagram of FIG. 4, where

FIG. 4A is a simplified diagram of MCU/ADC tile 18. MCU/ADC tile 18 includes the processor 32, as well as the numerous other blocks pictured. In the specific example illustrated, the vertically extending conductors of the standardized bus 24 do not extend through the MCU/ADC tile 18 but rather extend vertically just outside the right edge of tile 18. The configuration registers 27 and 28 (see FIG. 3) and other circuitry interfaces to these vertically extending bus conductors of standardized bus 24.

A program of processor-executable instructions 37 can be loaded into MTPMIC 2, can be stored into RAM/FLASH memory block 38, and can be executed by processor 32. RAM/FLASH block 38 represents data and program memory for processor 32. RAM/FLASH memory block 38 is a processor-readable medium that is accessible across processor local bus 34. Processor 32 accesses the processor local bus 34 via conductors 39, 40 and 41 as shown. The arrow 26 labeled VCORE indicates that the processor is entirely powered from the VCORE supply voltage. The VCORE supply voltage is generated by a linear regulator in the power manager tile (see FIG. 4C) and is supplied to MCU/ADC tile 18 via a power supply conductor (not shown) of the standardized bus. When powered from this VCORE supply voltage, processor 32 can write to the configuration registers 27 and 28 across the standardized bus 24 via bus interface block 42.

If processor 32 is to write data into a particular configuration register, then processor 32 writes the data to be written into bus interface block 42. Bus interface block 42 puts the data onto the DIN[0-7] data lines of the standardized bus 24. The processor 32 then writes an address into bus interface block 42. This address identifies which configuration register it is that is to be written. Bus interface block 42 includes a decoder that converts the address into a local clock strobe signal. This local clock strobe signal is communicated via dedicated conductors (not shown) of the standardized bus to the associated one of the configuration registers. The standardized bus includes one such dedicated digital line for carrying the local clock strobe for each configuration register. The local clock strobe causes the data on DIN[0-7] to be written into the strobed configuration register. In this way, processor 32 can write configuration information across the standardized bus 34 into any one of the configuration registers of the MTPMIC.

In the diagrams, an individual bit of a configuration register is represented by a small square surrounding an X. The memory cells of these individual configuration bits are not spread across the circuitry of the tile as illustrated, but rather are located together in what is referred to as a configuration register. Some of these configuration bits are located in MCU/ADC tile 18 but they are written across the standardized bus in the same way that they would be written were they located in another PMIC tile.

MCU/ADC tile 18 also includes an interrupt controller 43. Three programmable 8:1 multiplexers 44 are provided so that a signal from a selectable one of the data lines of the standardized bus can be supplied to the interrupt controller 43 to serve as an interrupting signal. In an actual design, the data input leads coupled to multiplexers 44 are coupled not to DIN[0-7] but rather are coupled to uncommitted digital conductors of the standardized bus. There is not adequate room in the diagram of FIG. 4A to show these uncommitted digital conductors so the input multiplexers 44 to the interrupt controller is shown coupled to DIN[0-7]. Which signal from the standardized bus it is that is supplied onto which of the three interrupt input leads INT[1-3] of the interrupt controller is freely programmable by processor 32 by setting the configuration bits that control the select inputs of multiplexer 44.

One of the data input leads of each of the 8:1 multiplexers 44 is coupled to what is referred to here as a "minipad". The symbol for a minipad in the diagrams is a dot surrounded by a square. Reference numeral 45 identifies one such minipad. Such a minipad can be coupled by a direct point-to-point uppermost metal layer conductor or bond wire to another minipad on the integrated circuit. In this way, in the present design, the three minipads of the three multiplexers 44 are coupled directly to minipads located in the signal manager tile 21 so that the signals coupled to interrupt controller input leads INT[1-3] are taken from three corresponding event signal detector circuits. The event signal detector circuits are described in further detail below. As illustrated in FIG. 4A, interrupt controller input lead INT[0] is hardwired to receive the CYCLE COMPLETE signal from the ADC sub-block as shown. Interrupt controller 34 supplies an interrupt request signal via conductor 46 to processor 32. Processor 32 can read and write the MASK and IRQ registers of the interrupt controller in standard interrupt controller fashion across processor local bus 34.

MCU/ADC tile 18 also includes three pairs of timers. Timers 47 and 48 are a first such pair. Each timer is operable in a one-shot mode or in a free running PWM mode, depending on the value of a corresponding ONE SHOT/FREE bit in the control register of the timer. Reference numeral 49 identifies the control register for TIMER1 47. Processor 32 can start TIMER1 47 by writing to a START CTRL bit in register 49. The duration of the pulse generated by TIMER1 in the one-shot mode, or the duty cycle and the period of the cycle of the signal generated by TIMER1 in the free-running PWM mode, is determined by the multi-bit COUNT value stored in register 49. The signal output by TIMER1 47 can be directed onto a selected one of various conductors of the standardized bus 24 by a demultiplexer 50. Processor 32 controls demultiplexer 50 by writing associated configuration bits coupled to the select input leads of the demultiplexer 50. One of the output leads of demultiplexer 50 is coupled to a minipad 51 as illustrated. The connection of the output of TIMER1 to the minipad 51 allows the signal output by TIMER1 to be coupled directly to another part of the integrated circuit via an uppermost metal layer conductor or bond wire and another suitably placed minipad. Processor 32 can read and write to control register 49 of TIMER1 47 across the processor local bus 34 via interconnections 52. Each of the pairs of timers is coupled to the processor local bus 34 in a similar fashion.

The time base by which the timers increment is a clock signal provided on conductor 53. This is the same clock signal that clocks processor 32. In one example, a 4 MHz signal generated by an oscillator 54 and an external crystal (not shown) is increased in frequency by a Phase-Locked Loop (PLL) 55 up to 32 MHz, thereby generating the clock signal that clocks the processor. In another example, the oscillator 54 is not used, but rather a 4 MHz clock signal received via minipad 76 is used by PLL 55 as an input signal to generate the clock signal. Minipad 76 may be connected via a metal layer conductor or wire bonded to a corresponding minipad in the power manager tile 20 where a 4 MHz clock signal generated by a 4 MHz internal oscillator is present.

MCU/ADC tile 18 also includes an UART/SPI/I2C controller block 56. Processor 32 can read and write to the DATA and ADR registers of UART/SPI/I2C controller block 56 via processor local bus 34. By writing to and reading from the DATA and ADR registers in an appropriate fashion, processor 32 controls the receiving and transmitting of data across GPIO terminals 57 and 58 using the UART or SPI or I2C protocol. These GPIO terminals 57 and 58 are coupled to the USB TO SPI/I2C dongle 13 illustrated in FIG. 1.

Each GPIO terminal is part of an associated GPIO block. GPIO block 59 is the GPIO block of which GPIO terminal 57 is a part. GPIO block 60 is the GPIO block of which GPIO terminal 58 is a part. Each GPIO block can be configured in a selected one of various ways depending on the values of two configuration bits associated with the GPIO block. Processor 32 can write these configuration bits across the standardized bus. In the example of GPIO block 60, if the upper lead 61 is not being used to communicate a SCLK signal out of MTPMIC 2, then the lower lead 62 is usable as an analog input terminal to receive an analog signal received onto terminal 58. This analog signal is communicated across one of conductors 63 to the ADC sub-block portion 23 for subsequent analog-to-digital conversion.

ADC sub-block 23 includes an Analog-to-Digital Converter (ADC) 64 and a sequencer 65. The sequence of operations carried out by sequencer 65 is controlled by processor 32 by writing control values into sequencer 65 across the processor local bus via interconnections 66. Sequencer 65 can write to an ADC control register 67. Setting bit CEN of register 67 enables and starts the ADC 64 performing an analog-to-digital conversion. When the conversion is complete, the ADC 64 communicates this status back to sequencer 65 by writing a digital high value into the CC bit of ADC control register 67. The signal manager tile 21 includes sample and hold circuits for sampling voltage signals on certain nodes. The sequencer 65 can cause these sample and hold circuits to perform a sample operation by setting a S/H bit in ADC control register 67. Setting this S/H bit causes a rising edge of the S/H signal to be supplied onto conductor 68. This S/H conductor 68 is in turn coupled to the sample and hold circuits. The interconnection between S/H conductor 68 in the ADC sub-block and the S/H input leads of the sample and hold circuits in the signal manager tile in this case is by a committed digital conductor of the standardized bus. This committed digital conductor is not shown in FIG. 4A due to the scarcity of space on the diagram, so the S/H conductor extending from the ADC control register 67 is shown extending to one of the DIN[0-7] conductors.

Sequencer 65 can also control which one of multiple signals will be supplied onto the ANALOG IN input lead 69 of ADC 64 for conversion. This control is provided by multiplexer 70. Multiplexer 70 is a much larger multiplexer and has many more input leads than is pictured in FIG. 4A. Some of the input leads of multiplexer 70 are coupled to minipads 77. These minipads may, for example, be connected by direct minipad-to-minipad uppermost metal layer conductors or wire bonds to various terminals and nodes of driver manager and signal manager tiles. Other input leads 78 and 79 of multiplexer 70 are coupled to analog signal lines of the standardized bus.

In one example, processor 32 writes a series of 0-bit values into a set 71 of 4-bit registers in a data logging buffer 72. Each 4-bit value identifies a node, the voltage of which is to be measured by ADC 64. The order of 4-bit values written into the set 71 of registers determines the order that the ADC conversions will occur. Sequencer 65 reads a 4-bit value, and controls multiplexer 70 to couple the associated node to the ANALOG IN input lead of the ADC, and then causes a conversion to occur by writing to the CEN bit of the ADC control register 67. Sequencer 65 reads from and writes to data logging buffer 72 via control conductors 80. The resulting digital value is then stored into the associated one of a set 73 of data registers. The sequencer repeats this process, proceeding one by one down the list of 4-bit values in set 71. When one cycle of this operation is complete after performing a conversion for each 4-bit value present in register set 71, the data logging buffer 72 asserts the CYCLE COMPLETE signal on conductor 74. This signal interrupts the processor via the INT[0] input to interrupt controller 43 so that the processor 32 can then read the digital values in the data registers 73 via interconnections 75 across the processor local bus. Processor 32 controls the data logging process indirectly through sequencer 65 and by writing node ID values into set 71.

Driver Manager Tile

Figure 4B:
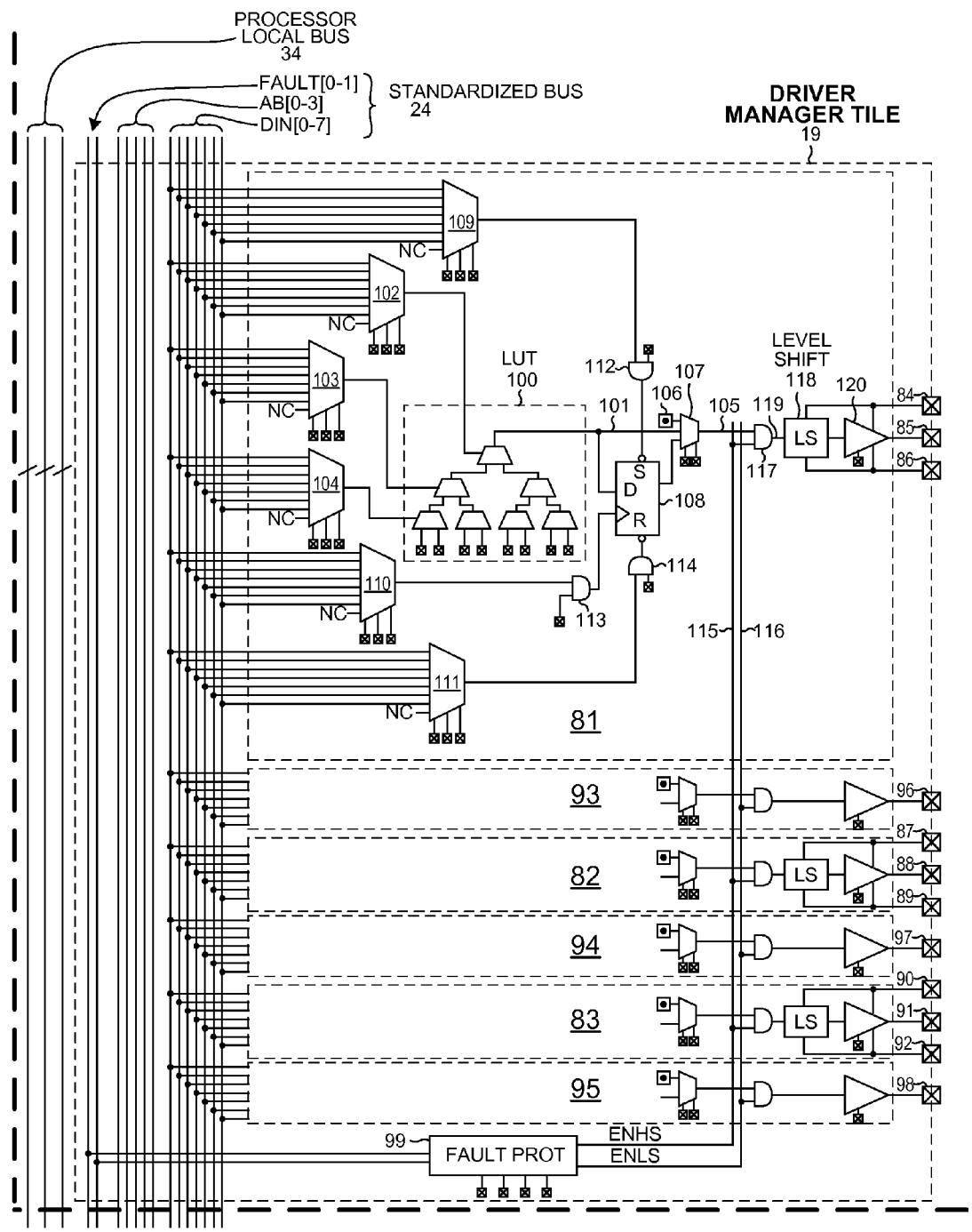

FIG. 4B is a simplified diagram of driver manager tile 19. Driver manager tile 19 includes three high-side driver circuits 81-83 and associated terminals 84-92, three low-side driver circuits 93-95 and associated terminals 96-98, a fault protection circuit 99, and a vertically extending bus portion of the standardized bus. One of the high-side driver circuits 81 is shown in detail. Look Up Table (LUT) structure 100 outputs a digital signal onto conductor 101. LUT structure 100 can be programmed so that the logical value of this digital signal is any desired combinatorial function of the logic values on any selected three of the digital bus conductors DIN[0-7]. The three configuration bits associated with multiplexer 102 determine the first selected one of the three DIN[0-7] signals, the three configuration bits associated with multiplexer 103 determine the second selected one of the three DIN[0-7] signals, and the three configuration bits associated with multiplexer 104 determine the third selected one of the three DIN[0-7] signals. The combinatorial logic function performed by the LUT is determined by the eight configuration bits shown within the dashed block labeled LUT. All these configuration bits are programmed by processor 32 by writing configuration register 29 across the standardized bus. The output of LUT 100 can be supplied directly onto node 105, or a registered version of the output of the LUT can be supplied onto node 105, or the signal on a minipad 106 can be supplied onto node 105, depending on the values of two configuration bits that set the select input values of multiplexer 107. Processor 32 determines which of the DIN[0-7] signals are supplied to the clock, the set, and the reset input leads of flip-flop 108 by programming the configuration bits for multiplexers 109-111 and AND gates 112-114 appropriately. The configuration bits of the AND gates coupled to the set and reset input leads of the flip-flop are usable by the processor to strobe reset the flip-flop and to strobe set the flip-flop.

There are two vertically extending fault signal conductors 115 and 116. Fault signal conductor 115 carries the active high enable high-side signal ENHS. Fault signal conductor 116 carries the active high enable low-side signal ENLS. Asserting ENHS high enables the high-side drivers to drive their respective terminals, whereas deasserting ENHS low disables the high-side drivers. Asserting ENLS high enables the low-side drivers to drive their respective terminals, whereas deasserting ENLS low disables the low-side drivers. In the case of the uppermost high-side driver 81, AND gate 117 supplies a digital signal to level shift circuit 118. Level shift circuit 118 level shifts a zero volt digital logic low value on node and conductor 119 to the voltage level on terminal 84, and level shifts a 5.0 volt (internal VDDIO) digital logic high value on node and conductor 119 to the voltage level on terminal 86. Driver 120 comprises a chain of logic inverters of ever increasing size, where the source of the N-channel pull down transistor of the last inverter is coupled to terminal 86, and where the source of the P-channel pull up transistor of the last inverter is coupled to terminal 84, and where the output lead of the last inverter of the chain is coupled to terminal 85.

In one external configuration, an external bootstrap capacitor is coupled across terminals 84 and 86 of the high-side driver. This bootstrap capacitor is charged through an external diode to have a voltage of main supply voltage VP (for example, 12 volts) minus a 0.7 volt diode drop. When an external low-side N-channel transistor is turned on and is conductive, terminal 86 is pulled to ground potential through the on and conductive external low-side N-channel transistor. Current therefore flows from the 12 volt VP source, through the forward biased external diode, and through the bootstrap capacitor, and to ground potential on terminal 86. This current flow charges the bootstrap capacitor to 11.3 volts when the low-side N-channel external transistor is on. The gate of an external high-side N-channel field effect transistor is coupled to terminal 85, and the source of the high-side N-channel transistor is coupled to terminal 86, and the drain of the high-side N-channel transistor is coupled receive a supply voltage VIN such as 48 volts DC. When this external high-side N-channel transistor is controlled to be on and conductive, the 48 volt VIN (at the drain of the high-side N-channel transistor) is coupled through the high-side N-channel transistor onto terminal 86. 48 volts is therefore present on terminal 86. Due to the prior charging of the bootstrap capacitor, an additional 11.3 volts is now present on terminal 84. Driver 120 can therefore drive the gate of the external high-side N-channel transistor to 59.3 volts to maintain the external high-side N-channel transistor in the on and conductive state. If the external high-side N-channel transistor is to be turned off, then the driver 120 drives the gate of the external high-side N-channel transistor to 48 volts. The 48 volt VIN value and the 12 volt VP value are only examples. Accordingly, driver 120 is usable to drive signal levels onto the gate of an external high-side N-channel transistor, where the high level is the voltage on terminal 84 and where the low level is the voltage on terminal 86.

The low-side driver circuits 93-95 of driver manager tile 19 are of similar construction to the high-side driver circuits, except that the low-side driver circuits 93-95 do not include the level shift circuits (such as level shift circuit 118) nor the bootstrap high and low terminals (such as terminals 84 and 86). The voltage levels driven by the low side drivers are 12 volt VP voltage for a high level and ground potential for a low level.

Fault protection circuit 99 is controlled by several associated configuration bits. These bits are writable across the standardized bus 24 by processor 32. The two input leads to the fault protection circuit are hardwired to the two dedicated fault protection conductors FAULT[0-1] of the standardized bus. The values of the configuration bits determine the logical function performed by the fault protection circuit on the FAULT[0-1] signals to generate each of the ENHS and ENLS output signals. Although the configuration bit symbols in FIG. 4B are shown distributed across the tile, this is for ease of illustration. The configuration bits are bits of configuration register 29.

Power Manager Tile

Figure 4C:
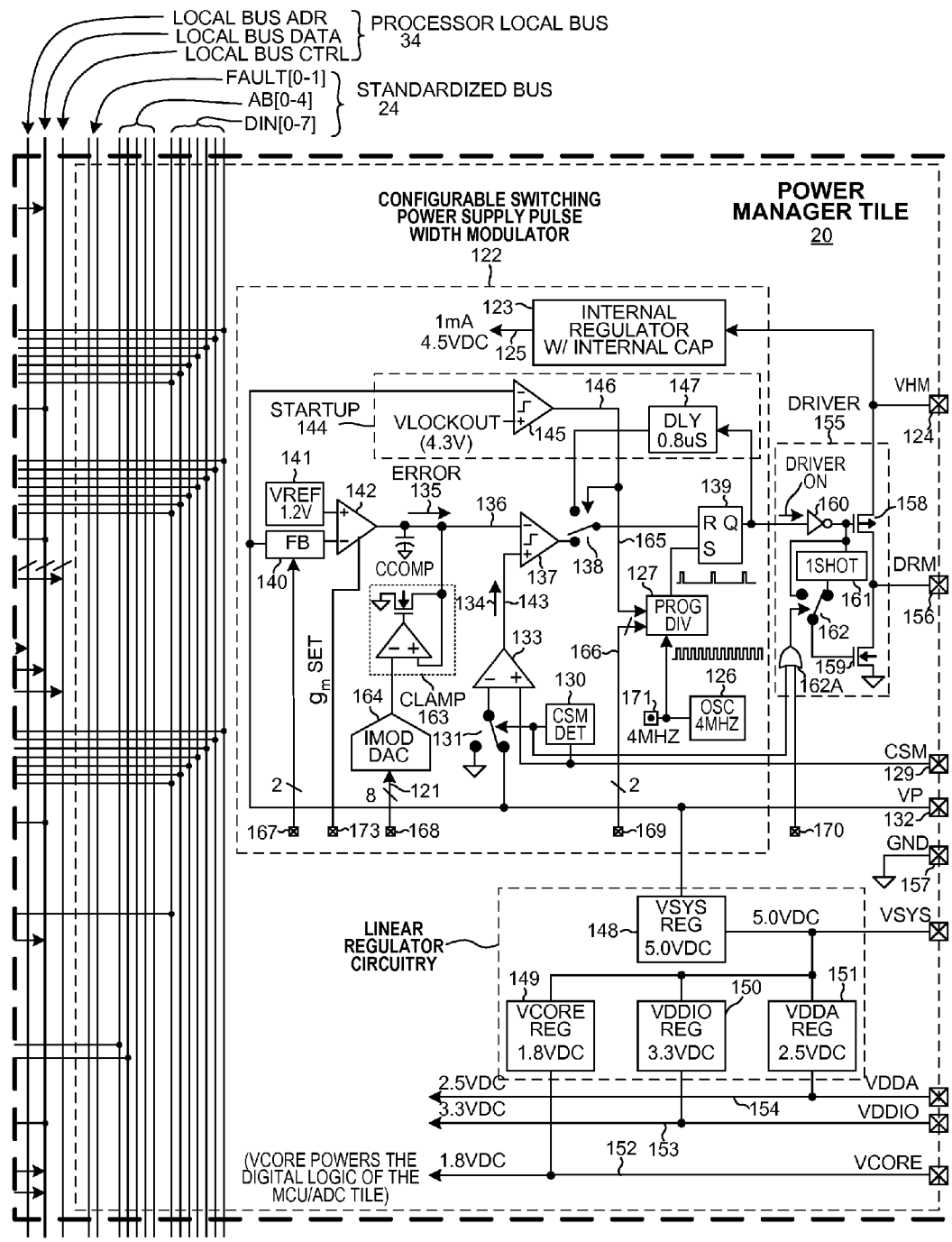

FIG. 4C is a simplified diagram of power manager tile 20. Power manager tile 20 is operable to receive power from a selectable one of a variety of different external power sources that might be available in a given application. Such an external power source might be, for example, a battery such as a 48V lead acid battery or lithium-ion battery pack, a solar cells array, an AC power source such as standard 110 volt AC wall power, or the output of an external power supply such as an external 5.0 volt DC wall adapter. The power manager tile receives power from the external power source and outputs supply voltages that satisfy all the power needs of the MTP-MIC 2 and all the power needs of the overall circuit 10. To achieve this flexibility, the power manager tile 120 includes a set of configurable pulse width modulator components referred to as the Configurable Switching Power Supply Pulse Width Modulator (CSPSPWM) 122. The CSPSPWM 122 is configurable in different ways along with a small number of select external components (external to MTPMIC 2) to realize a step down converter, or a high voltage step down converter that accepts an input supply voltage of up to 400 volts, or a flyback converter, or a boost converter.

CSPSPWM 122 includes a small, low-output current, internal linear regulator 123. This internal linear regulator 123 receives an unregulated voltage via terminal VHM 124 and outputs a regulated 4.5 volt DC source. Internal regulator 123 does include a small capacitor but because the regulator 123 only outputs a maximum of one milliamperes of supply current, the capacitor of the linear regulator can be provided on-chip. Connections between the output lead 125 of the regulator to the other circuits of CSPSPWM 122 are not shown, but the internal regulator 123 is used to power the remainder of the CSPSPWM 122.

An internal RC oscillator 126 generates a 4 MHz signal. This 4 MHz signal is divided down by programmable divider 127 to generate an output square wave digital signal that starts each pulse of the signal output by CSPSPWM 122. The frequency of the signal output by programmable divider 127 is a selectable one of the following: 12.5 kHz, 50 kHz, 100 kHz, 200 kHz and 400 kHz. Two programmable configuration bits received via conductors 166 determine which one of 50 kHz, 100 kHz, 200 kHz and 400 kHz will be output if a third control bit one conductor 165 is a digital logic low. If the third control bit on conductor 165 is a digital logic high, then programmable divider 127 outputs a 12.5 kHz square wave.

During each on pulse of the main external switch, the current flowing through the main external switch increases. Current sense terminal CSM 129 is used to detect the magnitude of this increasing current by measuring a voltage drop across an external current sense resistor. This external current sense resistor is disposed in the current path of the main switch. Depending on the type of switching power supply that the power manager tile is configured to be a part of, the current sense function performed by the CSM terminal 129 is either a high-side current sense or a low-side current sense. A CSM mode detect block 130 receives the voltage on the CSM terminal 129 and from this voltage determines whether the CSM terminal has been connected in a high-side current sense configuration or in a low-side current sense configuration. FIG. 16 is a more detailed circuit diagram of CSM mode detect block 130. The CSM mode detect block 130 does this by detecting the CSM voltage when the external switch is being controlled from terminal 156 to be off. If the CSM voltage is less than 0.5 volts when the external switch is being controlled to be off, then CSM mode detect block 130 determines that the power manager tile is connected to require low-side current sense, otherwise if the CSM voltage is higher than 0.5 volts when the external switch is being controlled to be off then CSM mode detect block 130 determines that the power manager tile is connected to require high-side current sense. If the CSM mode detect block 130 detects that high-side current sense is required, then the CSM mode detect block 130 controls switch 131 to couple the voltage from terminal VP 132 onto the inverting input lead of amplifier 133 such that the amplifier 133 amplifies the voltage difference between the voltage on terminal CSM and the voltage on terminal VP. If the CSM mode detect block 130 detects that low-side current sense is required, then the CSM mode detect block 130 controls switch 131 to couple ground potential from terminal 157 onto the inverting input lead of amplifier 133 such that the amplifier 133 amplifies the voltage difference between the voltage on terminal CSM and ground. In this example, a single amplifier 133 is shown with selectable signals for the inverting input, but the same operation can also be realized with separate dedicated amplifiers (not shown) for high-side current sense and low-side current sense with their outputs selected by the CSM mode detect block 130.

When the overall switching power supply (CSPSPWM, driver, and external components) is operating, and when the main external switch of the power supply is controlled to be on during a pulse, the amplified current sense signal 134 output by amplifier 133 increases until it exceeds the magnitude of an error signal 135 present on node 136. When the amplified current sense signal 134 exceeds this level, then comparator 137 switches its output signal level from a low digital level to a high digital level. This high digital level signal passes through switch 138 and resets flip-flip 139, thereby terminating the on pulse. Terminating the on pulse turns off the external main switch.

The main power supply output voltage VP being generated by the overall power supply is to be present on terminal VP 132. If the voltage on terminal VP 132 is higher then less power is required, whereas if the voltage detector on terminal VP 132 is lower then more power is required. Accordingly, the voltage difference between the voltage on terminal VP 132 (as divided down by a programmable resistor voltage divider FB 140) and a reference voltage (as output by a 1.2 volt bandgap voltage generator 141) is amplified by an error amplifier 142, thereby generating the analog ERROR signal 135 on node 136. As the switching power supply operates, the analog ERROR signal 135 goes up in voltage if more power is required and goes down in voltage if less power is required. If the ERROR signal 135 is made to be higher then during a switching cycle the rising current sense output signal 124 on node 143 will cause the on pulse of the main switch to be terminated later, whereas if the ERROR signal 135 is made to be lower then the current sense output signal 134 on node 143 will cause the on pulse of the main external switch to be terminated earlier.

The signal on the CSM terminal 129 is only considered valid for current sense purposes when the voltage VP on terminal 132 is greater than 4.3 volts. In a power supply start-up mode when voltage VP is still rising and is less than 4.3 volts, the CSM detect circuitry is not used to terminate on pulses but rather the pulse width modulation circuit is operated in a fixed 12.5 kHz low switching frequency safe mode using pulses of a fixed 0.8 microsecond pulse duration. In this start-up mode, the current sense is not needed and is not used but the power output capability of the power supply is quite degraded. Startup circuit 144 includes a comparator 145 that compares the voltage VP to the 4.3 volt VLOCKOUT voltage. If the voltage VP is less than 4.3 volts, then comparator 145 asserts the voltage level on node 146 to a digital low level resulting in divider 127 being controlled to output a 12.5 kHz square wave signal. In addition, the digital low level output by comparator 145 causes switch 138 to be switched to the up position. In the up position, the output of fixed delay element 147 terminates the on pulse after the fixed delay period of 0.8 microseconds.

As the power supply operates in the safe start-up mode, the voltage VP rises from cycle to cycle. Once the voltage VP rises to the point that it exceeds 4.3 volts, the pulse width modulator is made to operate in a power supply normal mode. Comparator 145 outputs a high level on node 146 causing switch 138 to switch into the down position so that the current detect circuitry 130 and 133 is used to terminate on pulses. The high digital level on node 146 stops controlling divider 127 to output the low 12.5 kHz frequency signal. Divider 127 therefore outputs its regular square wave of a higher switching frequency as determined by the two programmable configuration bits on conductors 166.

The operating of the power supply results in the VP output voltage being supplied via VP terminal 132 to linear regulator 148. From the VP supply voltage the linear regulator 148 generates a 5.0 volt DC supply voltage VSYS. Supply voltage VSYS in turn powers three other linear regulators 149-151. These linear regulators 149-151 output regulated supply voltages of 1.8 volts VCORE, 5.0 volts VDDIO, and 3.3 volts VDDA on conductors 152-154, respectively. The 1.8 volt VCORE voltage on conductor 152 powers the digital logic of the MCU/ADC tile including processor 32. Once processor 32 is powered up and operating from this 1.8 volt VCORE source, then processor 32 can write configuration information back into the configuration register 27 of the power manager tile 120 to change operation of CSPSPWM 122.

A programmable driver 155 receives the signal output by the CSPSPWM 122 (the output of flip-flop 139 in the illustrated example) and drives driver terminal DRM 156. If the signal supplied to driver 155 is a digital logic high then driver 155 outputs the voltage on the VHM terminal 124 onto the DRM terminal 156. This corresponds to turning on the external switch. If, on the other hand, the signal supplied to driver 155 is a digital logic low then driver 155 outputs the voltage on ground terminal 157 onto the DRM terminal 156. This corresponds to turning off the external switch.

In a first drive mode, driver 155 drives the DRM terminal 156 either to ground potential to turn off the external main switch, or the DRM terminal 156 is driven to the VHM voltage to turn on the external switch. The DRM terminal is driven to the voltage on the VHM terminal by turning on P-channel field effect transistor 158 and turning off N-channel field effect transistor 159. The DRM terminal is driven to ground potential by turning off P-channel field effect transistor 158 and turning on N-channel field effect transistor 159. The switch 162 is set so that the signal output by inverter 160 bypasses RC one-shot 161 and is supplied directly to the gate of the N-channel field effect transistor 159. The RC one-shot 161 therefore has no effect on the output of the driver circuit 155.

When driving an external NPN transistor in high-side current-sensing mode in some configurations, to improve efficiency, a second drive mode is used. In the second drive mode (a "pulse pull down mode"), the driver 155 drives the DRM terminal 156 to the VHM voltage to turn on the external main switch. When the external main switch is to be turned off, however, the DRM terminal 156 is initially pulled to ground potential (the voltage on terminal 157) strongly for about 250 nanoseconds and thereafter the DRM terminal 156 is not driven low but rather is put into a high impedance state until the external switch is to be turned on again. During the high impedance time, the external main switch is maintained in the off state by an external resistor coupled between the base and emitter of the external NPN switch. Not holding the base of the external NPN transistor at ground potential helps prevent power loss by preventing unwanted current flow back through the NPN transistor and out of the collector of the NPN transistor. The 250 nanosecond pull down pulse time is determined by the delay of RC one-shot 161. In the second mode, switch 162 is set so that the output of inverter 160 is coupled via one-shot 161 to the gate of N-channel pull down field effect transistor 159. Whether the driver circuit 155 operates in the first drive mode or the second drive mode is determined by the logical-OR of the value of a programmable configuration bit in configuration register 30 and the output of CSM mode detect block 130 that determines whether the CSPSPWM 122 operates in a low-side current sensing mode or in a high-side current sensing mode. The logical-OR function is provided by OR gate 162A.

The ERROR signal 135 output by error amplifier 142 is an analog signal, but its highest possible signal level is limited by a DC clamp circuit 163. The output lead of DC clamp circuit 163 is coupled to the output lead of error amplifier 142. The voltage level to which the clamp circuit 163 clamps the highest possible signal level of the ERROR signal 135 is programmable and is set by setting the 8-bit input value supplied onto the inputs 121 of an 8-bit IMOD digital-to-analog converter (DAC) 164. The 8-bit input to IMOD DAC 164 is written by processor 32 across the standardized bus 24 (or in other examples via processor local bus 34). If the voltage VP on terminal 132 is too low for the overall power supply to be in regulation, then the clamp circuit 163 is controlled such that the maximum value of the error signal is clamped to 2.5 volts. This limits the magnitude of each current pulse during an on pulse of the power supply. The IMOD DAC 164 can also be used to effectively disable the feedback through error amplifier 142. This is done by controlling IMOD DAC 164 to clamp the ERROR signal 135 to ground potential so that error amplifier 142 cannot affect the voltage on node 136.

In addition, IMOD DAC 164 can be used to provide digital feedback loop power control by processor 32 such as power factor correction or more accurate regulation of output power attributes based on ADC measurements. In order to realize a power factor corrected power supply, the input current flowing into the power supply is made to track up and down with the rising and falling input line voltage. If the level of the output voltage being output by the power supply is higher than desired, then power supplied to the load should be reduced, whereas if the level of the output voltage is lower than desired then power supplied to the load should be increased. The way this type of power factor correction is achieved involves the MCU/ADC tile. The processor of the MCU/ADC tile and its associated ADC measures the input line voltage and based on these measurements determines a profile of the line voltage signal. The ADC also measures the DC output voltage VP being output by the power supply. Based on these measurements the processor 32 sets the current clamp level on node 136 so that as the input line voltage level changes over a cycle of the AC input line voltage the current clamp level changes proportionally. Processor 32 adjusts the current clamp level once every ten microseconds by writing to the 8-bit IMOD DAC 164. In this mode, processor 32, IMOD DAC 164, and clamp 163 are to take over control of the control loop from feedback circuit 140 and error amplifier 142. As long as the voltage level to which error amplifier 142 would drive node 136 is higher than the voltage to which clamp 163 has clamped the voltage on node 136, the voltage on node 136 will be determined by the clamp 163 (as controlled by the processor 32 via IMOD DAC 164). Accordingly, the feedback circuit 140 in the digital feedback control mode is controlled so that the signal output by amplifier 142 is railed to its maximum high level. The railed high voltage output by error amplifier 142 is higher than the voltage to which clamp circuit is to clamp the voltage on node 135, so the error amplifier does not affect loop operation. The feedback circuit 140 is effectively disabled. The processor 32 therefore controls the voltage on node 163 via clamp 163. Likewise, in other embodiments requiring accurate control or additional processing of an attribute or a set of attributes of the output power, the processor of the MCU/ADC tile and its associated ADC measure the output power attributes and maintain digital feedback loop control based on these measurements. The processor 32 sets the current clamp level on node 135 so that more power is delivered when a measured attribute is lower than the required level, and less power is delivered when a measured attribute is higher than the required level. Processor 32 adjusts the current clamp level periodically by writing to the 8-bit IMOD DAC 164.

Error amplifier 142 has a very high fixed gain but also has a programmable transconductance $g_m$. Programmable configuration bit 173 determines whether the error amplifier transconductance is $g_m$=1 uS or $g_m$=4 uS. Processor 32 can write to configuration register 30, and thereby change the value of configuration bit 73, thereby adjusting error amplifier transconductance and adjusting the loop gain bandwidth. CCOMP is a loop compensation capacitor of fixed capacitance.

The various configuration bits of the power manager tile 20 are identified by reference numerals 167-170 and 173. Although these bits are illustrated as being placed in different locations in the tile, the configuration bits are bits of single configuration register 30. Minipad 171 is provided so that the 4 MHz output signal of oscillator 126 can be supplied to minipad 76 of the MCU/ADC tile 18.

Signal Manager Tile

Figure 4D:
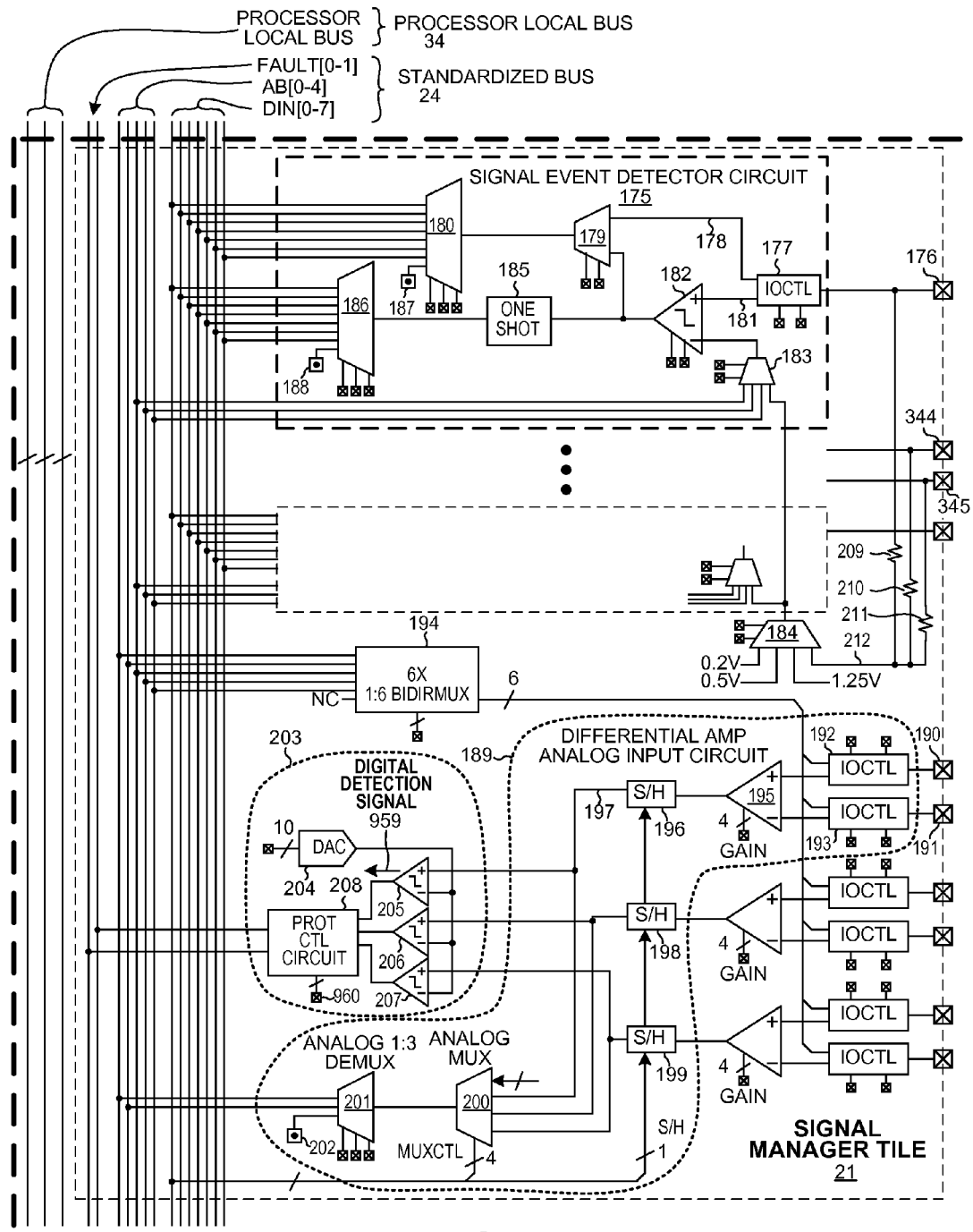
Figure 5A:
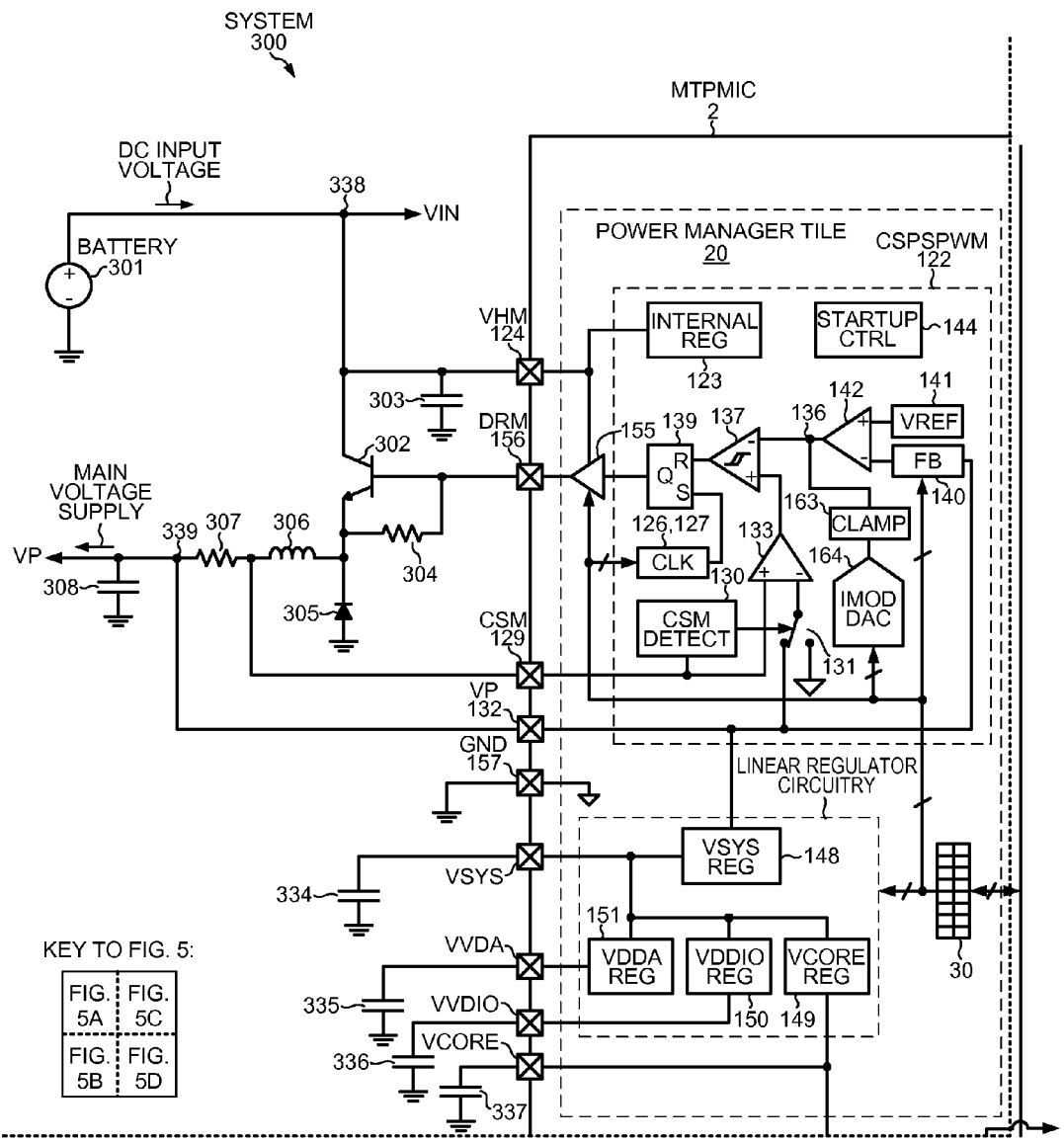
FIGS. 5A, 5B, 5C and 5D fit together to form a larger diagram of FIG. 5, where
Figure 5B:
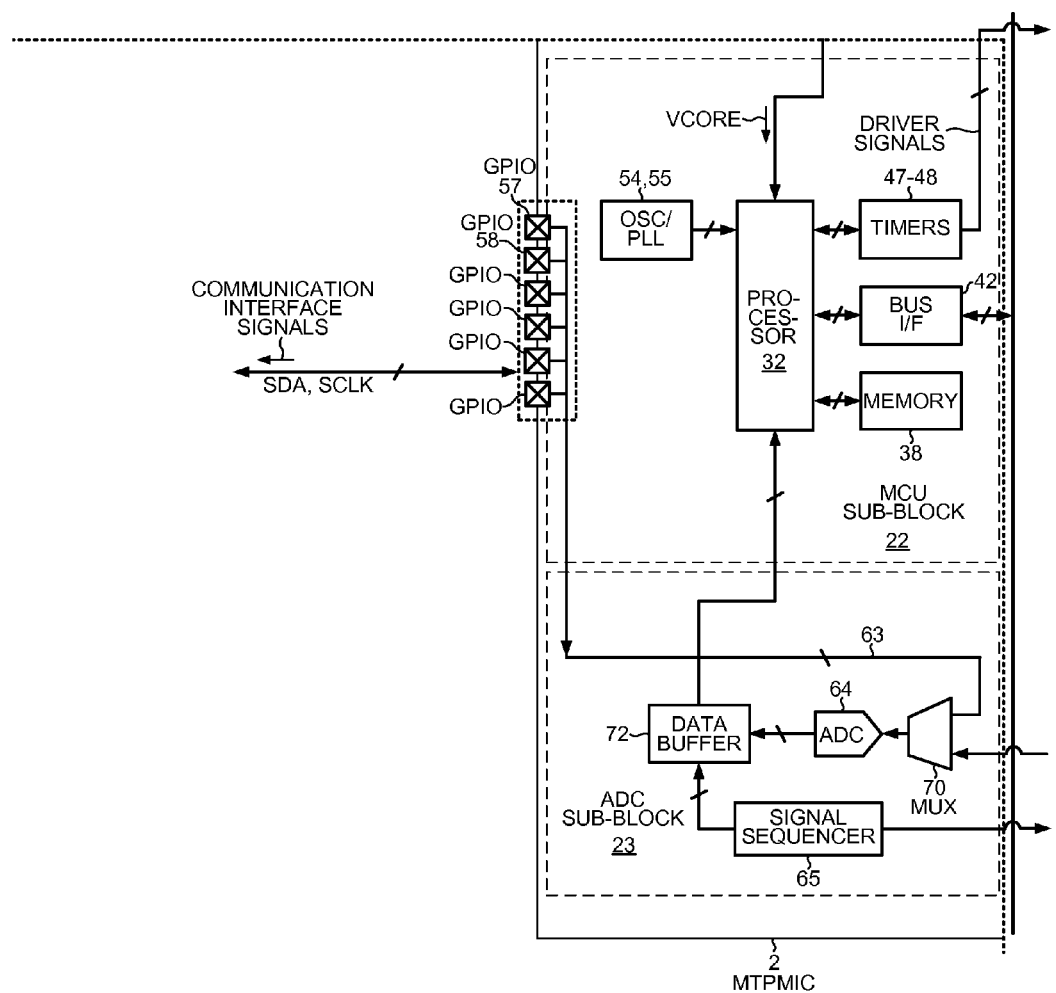
Figure 5C:
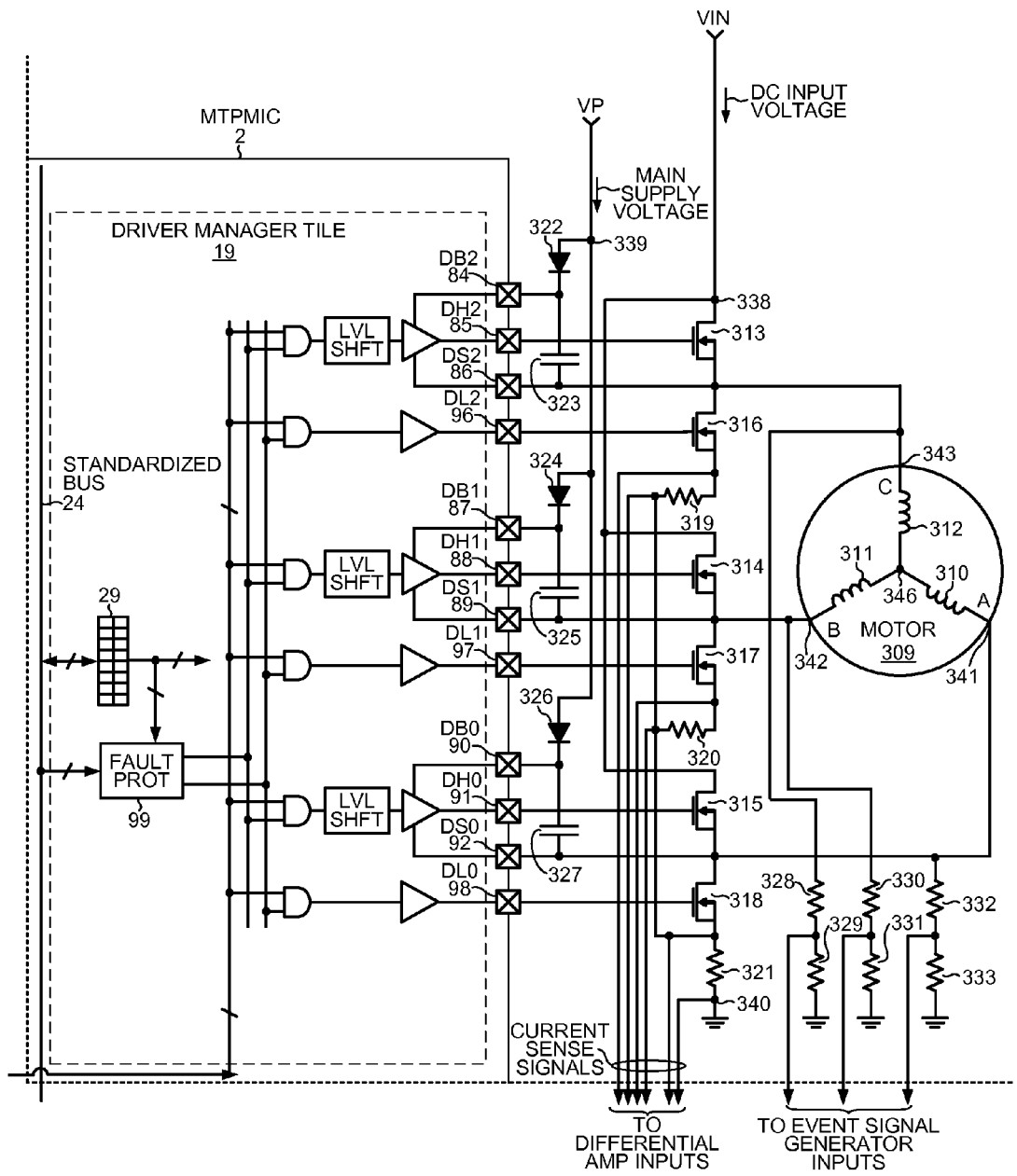
Figure 5D:
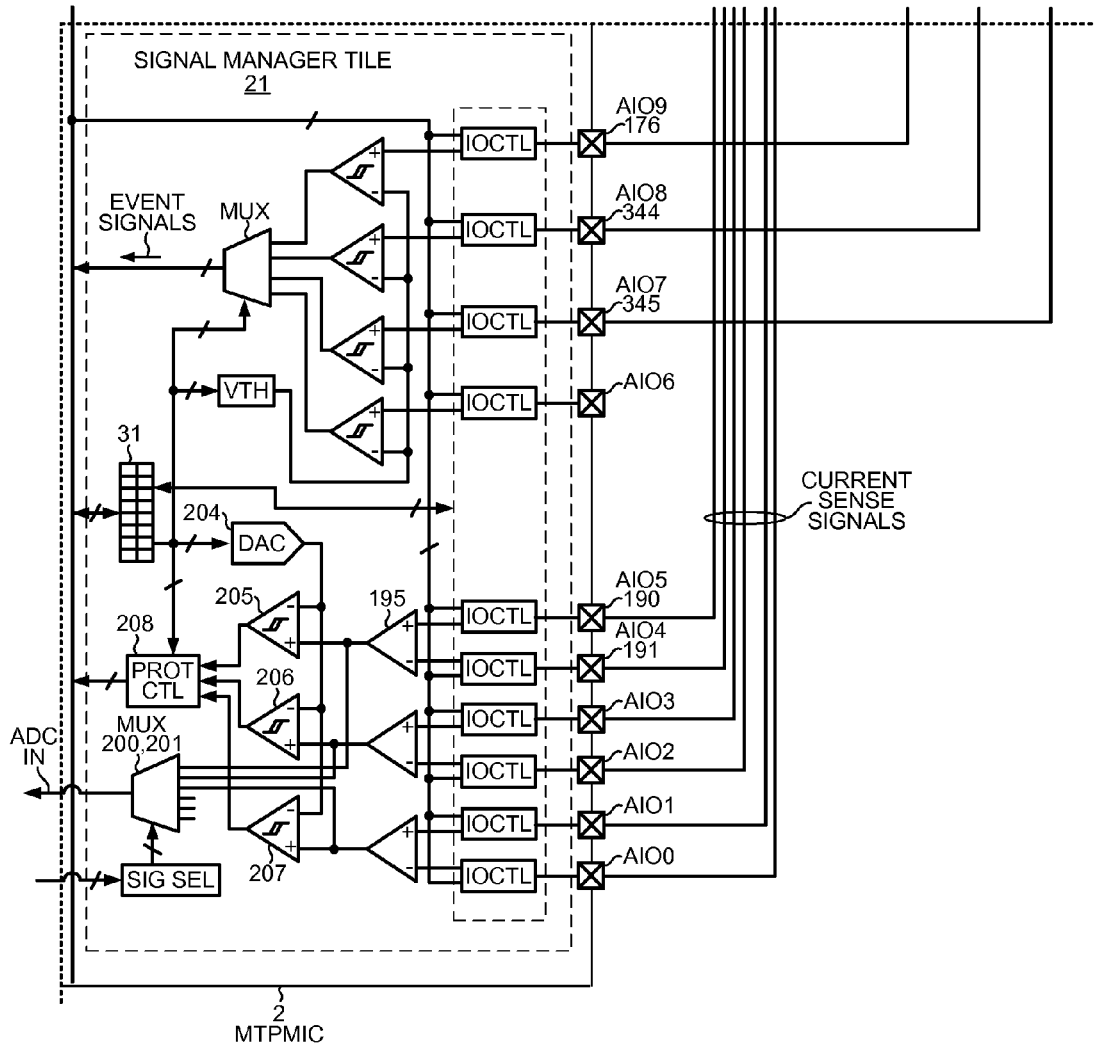
Figure 6A:
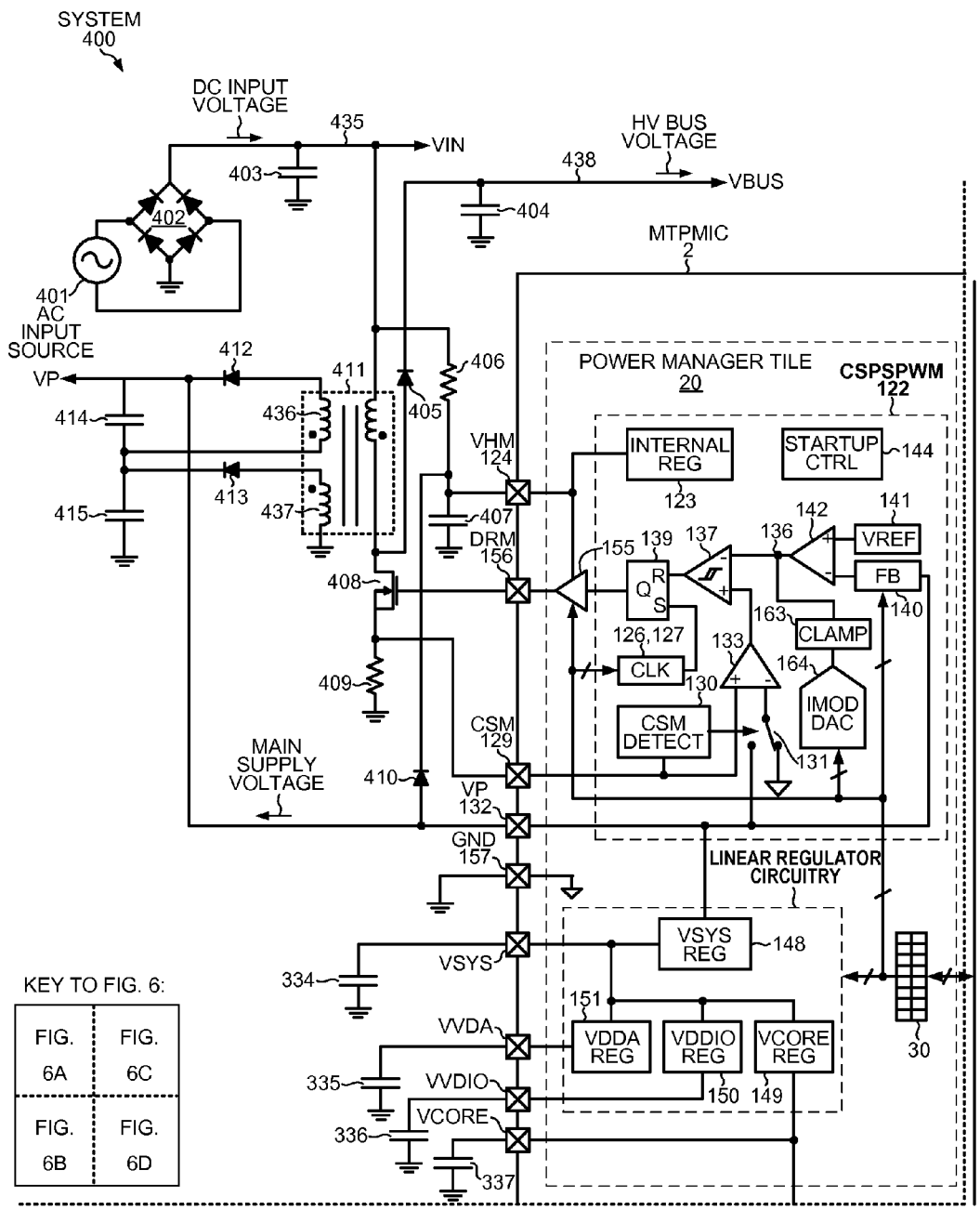
FIGS. 6A, 6B, 6C and 6D fit together to form a larger diagram of FIG. 6, where
Figure 6B:
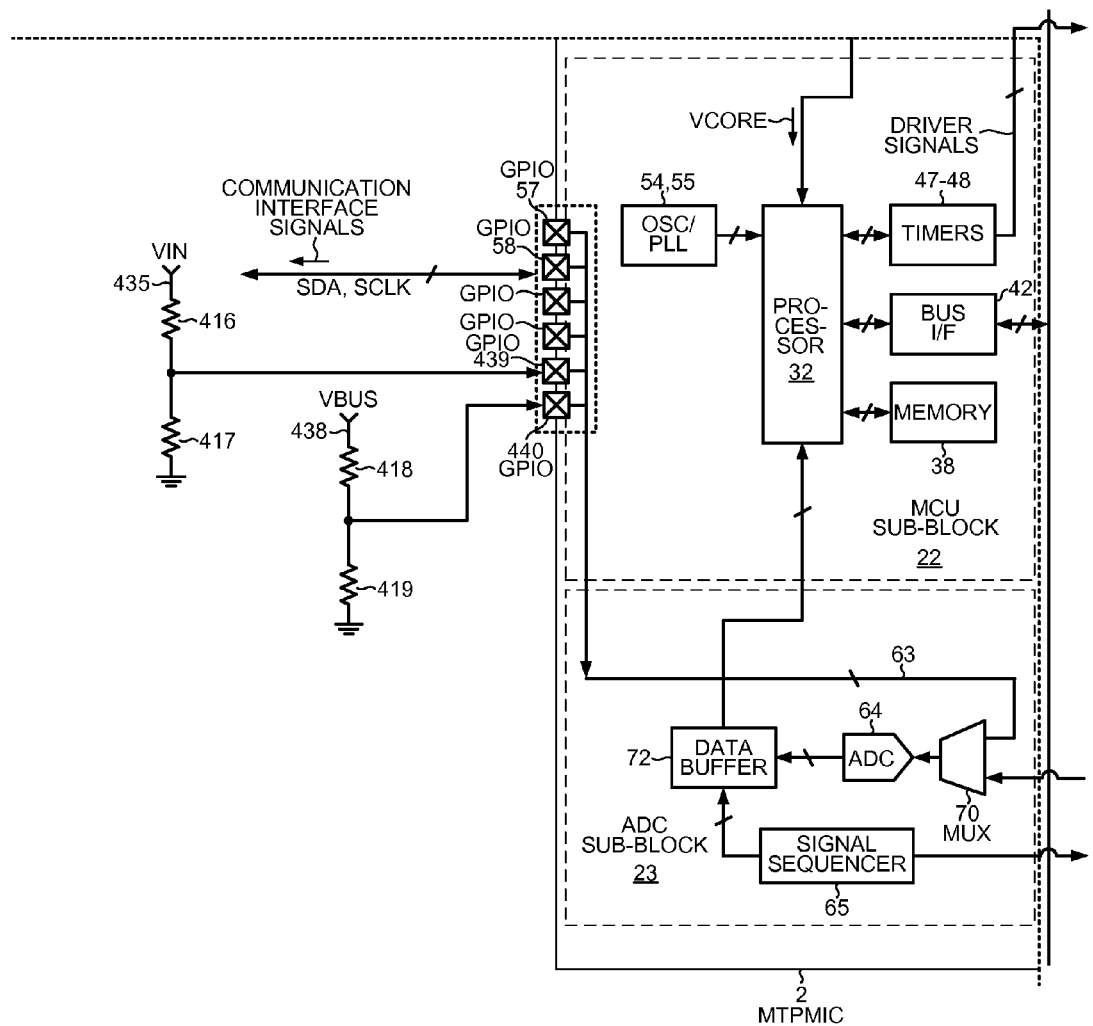
Figure 6C:
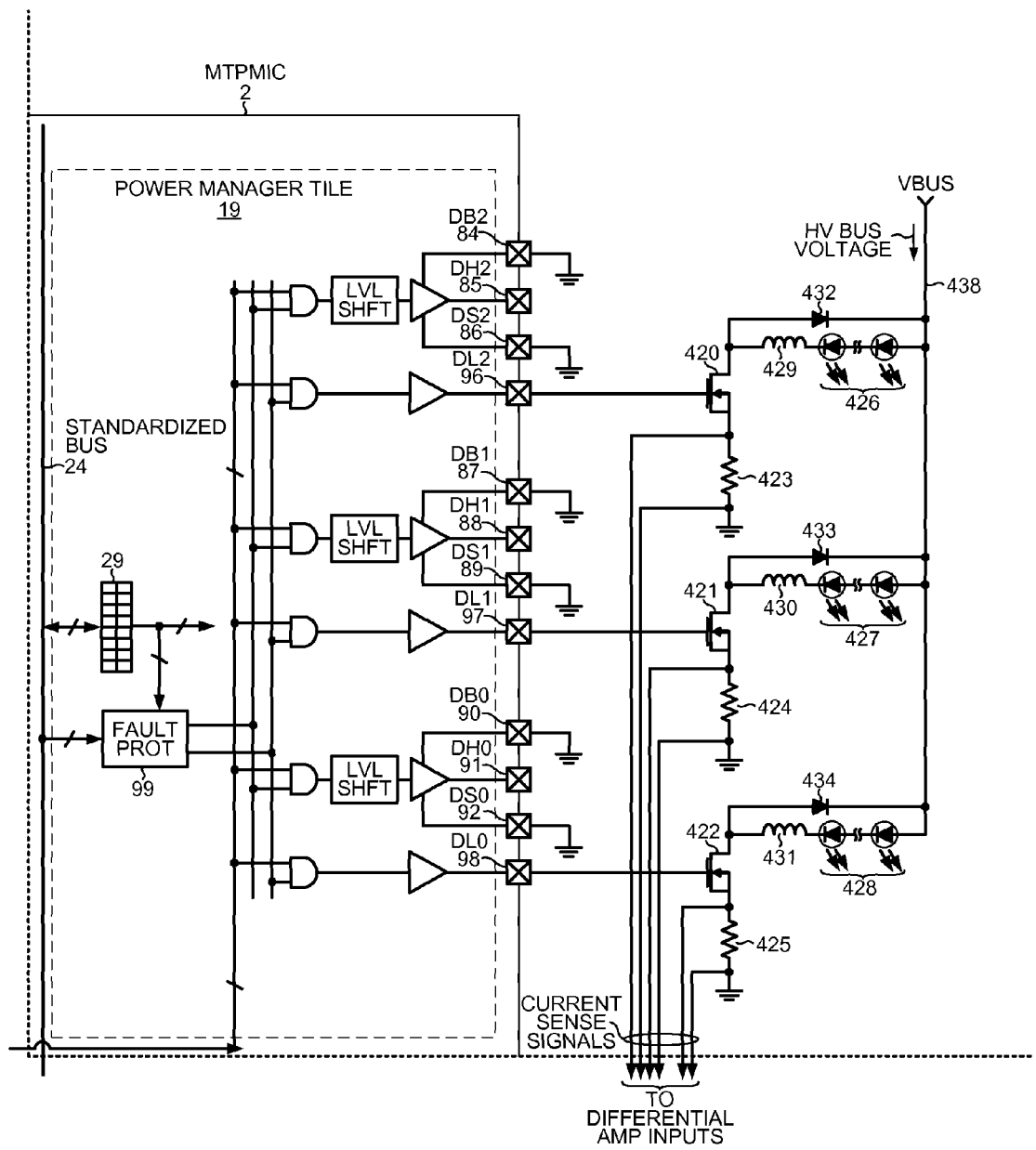
Figure 6D:
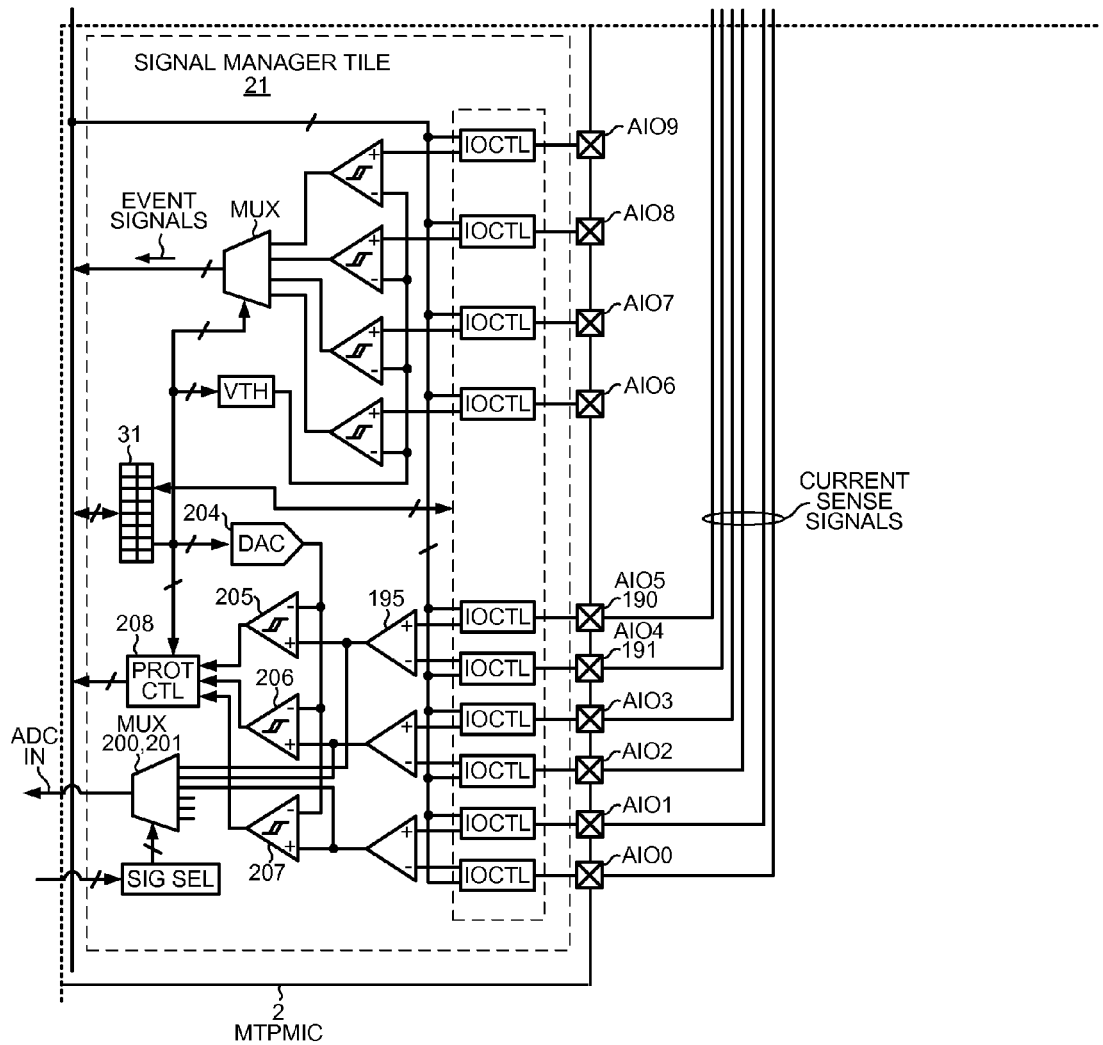

FIG. 4D is a simplified diagram of signal manager tile 21. Signal manager tile 21 includes four event signal detector circuits, three differential amplifier analog input circuits, a bus portion of the standardized bus, and a fault protection circuit. One of the event signal detector circuits 175 is shown in detail in FIG. 4D. The terminal 176 has an associated programmable I/O block 177. In this case, the terminal is not illustrated to be part of the I/O block. Processor 32 can set the two configurable bits that control the programmable I/O block 177 across the standardized bus. In one configuration, an analog signal on terminal 176 is communicated via conductor 178, through multiplexer 179, and through programmable demultiplexer 180, and onto a selectable one of the conductors of the standardized bus 24. Typically the demultiplexer outputs are connected to ones of the uncommitted digital conductors of the standardized bus, but in FIG. 4D there is not enough space to show the uncommitted digital conductors. The outputs of the programmable demultiplexer are therefore shown coupled to DIN[0-7].

In another configuration of the tile, an analog signal on terminal 176 is communicated via conductor 181 to the non-inverting input lead of a comparator 182. The comparator 182 has two associated configuration bits usable to set an amount of hysteresis or to disable the comparator. The inverting input lead of the comparator 182 is supplied with a programmable threshold voltage. The programmable threshold voltage is supplied by a programmable multiplexer 183 of the signal event detector circuit. The two configuration bits of programmable multiplexer 183 are writable by processor 32 across the standardized bus. Three of the input leads of programmable multiplexer 183 are coupled to three of the AB[0-4] analog conductors of the standardized bus. The fourth input lead of programmable multiplexer 183 is coupled to receive a programmable voltage received from a common programmable analog multiplexer 184. Common programmable analog multiplexer 184 is programmable under the control of processor 32 to supply a selectable one of the voltage on node 212, 0.2 volts, 0.5 volts, and 1.25 volts onto the fourth input lead of multiplexer 183. As illustrated, one programmable multiplexer 184 is used for all four of the signal event detector circuits. The digital output of comparator 182 can be supplied onto a selectable one of the conductors of the standardized bus via multiplexer 179 and demultiplexer 180.

A resistor 209 is coupled between terminal 176 and node 212. A resistor 210 is coupled between terminal 344 and node 212. A resistor 211 is coupled between terminal 345 and node 212. In one application, a first winding node A 341 of a motor 309 is coupled via an external resistor voltage divider to terminal 345; a second winding node B 342 of the motor is coupled via an external resistor voltage divider to terminal 344; and a third winding node C 343 of the motor is coupled via an external resistor voltage divider to terminal 176. The resulting voltage on node 212 is indicative of the voltage on the center node 346 of the motor. The resistances of resistors 209, 210 and 211 are identical.

In addition, the signal as output by comparator 182 is converted into a one-shot strobe signal by one-shot 185. The pulse signal output by one-shot 185 can be supplied onto a selectable one of DIN[0-7] as controlled by demultiplexer 186. Typically the demultiplexer 186 outputs are connected to ones of the uncommitted digital conductors of the standardized bus, but in FIG. 4D there is not enough space to show the uncommitted digital conductors. The outputs of the programmable demultiplexer 186 are therefore shown coupled to DIN [0-7].

One output lead of each of the demultiplexers 180 and 186 is coupled to a minipad 187, 188. In one example, one of these minipads is coupled directly to one of the minipads on the multiplexer input leading into the interrupt controller of FIG. 4A. Due to this direct minipad-to-minipad connection between the signal event detector circuit and the interrupt controller, if an analog signal on analog input terminal 176 is detected to exceed a programmable threshold voltage on the non-inverting input lead of comparator 182, then an event signal is generated by comparator 182. This event signal is then supplied through the a minipad to the interrupt controller to interrupt the processor.

The three differential amplifier analog input circuits are illustrated at the bottom of FIG. 4D. The upper differential amplifier analog input circuit 189 involving analog input terminals 190 and 191 is described below. Each analog input terminal is coupled to an associated programmable I/O block 192, 193. As described above in connection with the event detector circuits, each programmable I/O block allows the analog signal on its associated terminal to be coupled onto a conductor and to be communicated via a demultiplexer onto a programmable one of the conductors of the standardized bus. The conductors of the standardized bus to which the output leads of the demultiplexers are coupled can be varied and may include selected ones of AB[0-4]. The six 1:6 demultiplexers 194 are actually bidirectional demultiplexers involving pass gates, so analog signals can be communicated from the standardized bus to the analog terminals, or may be communicated from the analog terminals to the standardized bus. In another configuration of signal manager tile 21, the I/O blocks 192 and 193 may be configured to become input or output digital buffers, in which case the six 1:6 bidirectional demultiplexers 194 are digital bidirectional demultiplexers coupled to the selected signals of DIN[0-7] (not shown).

If the configuration bits for the programmable I/O blocks 192 and 193 are programmed differently, then the analog signals on the two terminals 190 and 191 are communicated onto the non-inverting and the inverting input leads of programmable differential amplifier 195. Four configuration bit are usable to set the gain of programmable differential amplifier 195. The output lead of the programmable differential amplifier 195 is coupled to a sample and hold circuit 196. When the sample and hold circuit 196 samples, the analog signal output by the programmable differential amplifier is captured by the S/H signal onto conductor 197. As described above in connection with the MCU/ADC tile, the S/H conductor 197 is coupled directly via a committed analog signal conductor of the standardized bus to the S/H bit of the ADC control register. The signal output by the sample and hold circuits 196, 198 and 199 can be conducted, one by one, via analog multiplexer 200 and analog demultiplexer 201 onto a selected one of the analog conductors of the standardized bus. In the present example, these two conductors are two of the AB[0-4] conductors. Alternatively, analog 1:3 demultiplexer 201 can output the analog signal onto a minipad 202. Minipad 202 may, for example, be coupled via a direct minipad-to-minipad uppermost metal layer conductor or wire bond connection to a minipad 77 on an input lead of the input multiplexer 70 of ADC 64. Accordingly, there several programmable signal paths by which signal output by a programmable differential amplifier of the signal manager tile can be supplied to the input of ADC 64 for analog-to-digital conversion.

Fault detection logic 203 is provided in the form of a programmable 10-bit Digital-to-Analog Converter (DAC) 204, three comparators 205-207, and protection control circuit 208. The 10-bit input to DAC 204 is programmable by processor 32 across the standardized bus.

In one example, protection control circuit 208 asserts the first protection level signal FAULT[0] if the voltage on a first selected terminal is detected to exceed the voltage on a second selected terminal by more than 100 millivolts. The protection control circuit 208 asserts the second protection level signal FAULT[1] if the voltage on a third selected terminal is 100 millivolts less than the voltage on the second selected terminal. These protection level signals FAULT[0] and FAULT[1] are communicated directly from the protection control circuit 208 in the signal manager tile 175, across the FAULT[0-1] conductors of the standardized bus, and to the driver manager tile 19 without being dependent upon any software processing. There are multiple different functions of the outputs of the three comparators 205-207 than can be used to determine the FAULT[0] and the FAULT[1] signals. The function selected is programmable by setting configuration bits across the standardized bus. Although configuration bit symbols are illustrated in FIG. 4D spread across the tile, the configuration bits are all part of the same configuration register 31.

Brushless Motor Controller Application

FIG. 5 is a diagram of a system 300 involving a brushless motor controller application of MTPMIC 2. FIGS. 5A, 5B, 5C and 5D fit together to form FIG. 5. FIG. 5 is a somewhat simplified schematic version of MTPMIC 2 shown in FIG. 4. A key showing how FIGS. 5A, 5B, 5C and 5D fit together in this way is provided at the bottom left of FIG. 5A.

System 300 includes MTPMIC 2 and external circuit components 301-337. The power manager tile 20 and the external circuitry 301-337 are configured to form a step down buck converter power supply. Some of the internal details of the CSPSPWM 122 portion of the power manager tile are omitted from FIG. 5 due to space constraints in the drawings. See FIG. 4A for additional details. In the configuration of FIG. 5, the voltage VIN on conductor 338 is a DC supply voltage as output by battery 301. VIN can range from approximately 12 volts to 48 volts. In the present example, VIN is 48 volts and battery 301 is a multi-cell lead acid battery. The NPN bipolar transistor 302 drives an inductor 306 in the step-down configuration, which generates the main supply voltage VP on node 339 and terminal VP 132. Resistor 307 is a current sense resistor. It is coupled between terminal CSM 129 and terminal VP 132. In the illustrated example, voltage VP is 12 volts. Capacitor 308 is the main storage capacitor of the power supply. The voltage VP generated by the power manager tile is used to power the other tiles of MTPMIC 2 and to supply power to the external switching circuitry 313-327 that drives the external motor 309. The switching cycle of the power supply is programmable and should be set to be in the range of from about 200 kHz to about 400 kHz. In the present example, the switching frequency is 12.5 kHz in a start-up mode and 200 kHz in a normal operating mode.

Before power is applied to the system, all circuits on MTPMIC 2 are unpowered. When battery voltage VIN is applied, the internal regulator 123 begins supplying 4.5 volt DC power to the power manager tile circuitry. Because the VP voltage is below the 4.3 VLOCKOUT voltage, the startup control block 144 controls the oscillator/divider 126/127 of CSPSPWM 122 to switch at a low 12.5 kHz frequency and with a fixed pulse width. These relatively infrequent pulses of safe and short durations are made to pulse the external NPN transistor 302 on in a safe manner. CSM mode detect block 130 determines that the current sense resistor is coupled in a high-side current sense configuration. In response, the CSM mode detect block 130 outputs a digital signal that controls the switch 131 to couple the non-inverting input lead of comparator 133 to the VP terminal 132. As CSPSPWM 122 causes the NPN transistor to be pulsed on from cycle to cycle, the voltage on storage capacitor 308 gradually increases. When startup control block 144 determines that voltage VP is above 4.3 volts, then startup control block 144 causes the power supply to start switching at the higher normal mode switching frequency. This normal mode switching frequency is determined by two configuration bits of configuration register 30 (see FIG. 3). Each of these bits includes a non-volatile cell and a volatile cell. On power up, the content of the non-volatile cell is automatically loaded into the volatile cell. The contents of the volatile cell is output from the configuration bit to configure the associated circuit. The normal mode switching frequency is programmed into non-volatile cells so that when the power manager tile enters normal operating mode it will switch at a predetermined appropriate frequency. The predetermined frequency for this configuration is typically in the range of from 200 kHz to 400 kHz. The startup control block 144, upon detecting that voltage VP is greater than 4.3 volts, also controls the feedback loop of the switching controller such that the pulse width of the on pulses is no longer a fixed value, but rather is modulated under control the current sense circuitry and the feedback circuitry.

The resulting voltage VP on terminal 132 is used to power linear regulators 148-151. External capacitors 334-337 are the external capacitors for these linear regulators. The VCORE supply voltage output by regulator 149 is used to power the processor 32 of the MCU/ADC tile 18. Power is supplied from the output of VCORE regulator 149 via a conductor of the standardized bus to the processor in the MCU/ADC tile 18. Once powered from supply voltage VCORE, the processor begins executing program code stored in RAM/FLASH 38. This program code causes the processor to then change the contents of certain configuration bits of the power manager tile by making appropriate writes across the standardized bus 24. The power manager tile 20 may, for example, be reconfigured in this way such that the driver 155 is programmed to operate in the pulse pull down mode.

In the motor control application of FIG. 5, each of the three windings 310-312 of motor 309 is coupled to a pair of N-channel Field Effect Transistors (NFET). In each pair there is a high-side NFET and a low-side NFET. The high side NFETS are 313-315. The low-side NFETs are 316-318. Current flow through the motor involves current flow from the 48 volt VIN conductor 338, through one of the high-side NFETs, through one winding, to center node 346 of the motor, and from the center node 346 of the motor through another winding, and then through a conductive low-side NFET, and through a current sense resistor to ground node and ground conductor 340. The current sense resistors 319, 320 and 321 are coupled to the differential amplifiers of the signal manager tile 21 as shown so that MTPMIC 2 can measure and monitor the voltage drops across the three current sense resistors.

Each high-side NFET is coupled to a charging diode and a bootstrap capacitor as illustrated. The charging diodes are diodes 322, 324 and 326. The bootstrap capacitors are capacitors 323, 325 and 327. A gate voltage higher than the 48 volt VIN voltage is required to keep a high-side NFET on and conductive. The bootstrap capacitors are coupled to provide about 59.3 volts on the terminals 84, 87 and 90. This 59.3 volts present on terminals 84, 87 and 90 allows the high-side drivers 81, 82 and 83 to drive the gates of high-side NFETs to 59.3 volts to turn these NFETs on. Operation of the bootstrap capacitors is described above in connection with the operation of the driver manager tile 19.

MTPMIC 2 is also coupled to sense voltage events on the three winding nodes 341-343 of the motor. Terminal 176 is coupled via resistor divider 328 and 329 to winding node C 343. Terminal 344 is coupled via resistor divider 330 and 331 to winding node B 342. Terminal 345 is coupled via resistor divider 332 and 333 to winding node A 341.

LED Driver Application

FIG. 6 is a diagram of a system 400 involving an LED driver application of MTPMIC 2. FIGS. 6A, 6B, 6C and 6D fit together to form FIG. 6. FIG. 6 is a somewhat simplified schematic version of MTPMIC 2 shown in FIG. 4. A key showing how FIGS. 6A, 6B, 6C and 6D fit together in this way is provided at the bottom right of FIG. 6A.

System 400 includes MTPMIC 2 and external circuit components 401-434. The power manager tile 20 and the external circuitry 401-434 are configured to form a boost converter. An AC input 401 is the source of power. In the present example, the AC input power source 401 is standard 110 volts AC standard household wall power. The 110 VAC is full wave rectified by diode bridge 402. The rectified signal is smoothed by storage capacitor 403 such that a rough DC input voltage is present on node 435. A FET 408 is coupled to pull pulses of current from VIN node 435 through the primary winding of a transformer 411. Resistor 409 is a current sense resistor coupled between terminal CSM 129 and terminal VP 132. A first secondary winding 436 and a second secondary winding 437 are provided with rectifying diodes 412 and 413 and storage capacitors 414 and 415 to generate the main supply output voltage VP voltage onto terminal VP 132. The first secondary winding (the upper one) outputs energy and charges its capacitor 414 in the FET on time, whereas the second secondary winding (the lower one) outputs energy and charges its capacitor 415 in the FET off time. The combinations of the voltages on capacitors 414 and 415 is the main supply output voltage VP. In this example, VP is 12.0 volts. A rectifying diode 405 and storage capacitor 404 are provided to output a high voltage DC supply VBUS output on node 436. In this example, VBUS is 400 volts DC.

CSM mode detect block 130 detects the CSM voltage when the FET 408 is off. In the topology of FIG. 6, because voltage CSM is less than 0.5 volts when the FET is off, the CSM mode detect block 130 detects a low-side current sense configuration and controls switch 131 so that ground potential is supplied onto the non-inverting input lead of comparator 133. As in the example of FIG. 5 described above, upon startup the processor 32 and the rest of MTPMIC 2 is unpowered. The internal regulator 123 and driver 155 initially receive start up power from the VIN voltage through resistor 406 and capacitor 407, until the supply voltage VP is higher than VHM at which point the VHM voltage is supplied by VP through diode 410. From VHM the internal regulator outputs 4.5 volts DC that powers the circuitry of CSPSPWM 122. As in the example of FIG. 5 described above, the startup control block 144 detects that VP is less than 4.3 volts, and in response controls the oscillator to begin switching the converter at a low 12.5 kHz switching frequency. The on pulse is made to be a fixed 0.8 microseconds. The FET 408 is pulsed on in this safe mode at a low rate and with short on pulses until the voltage VP reaches 4.3 volts. When voltage VP is detected to exceed 4.3 volts, then the switching frequency is changed to the predetermined switching frequency for normal mode operation. In this boost configuration, the predetermined switching frequency for normal mode operation is lower than in the case of the step-down buck converter of FIG. 5, and is typically about 50 kHz. In normal mode operation, the current sense and feedback circuitry is used to modulate the pulse width of the on pulses.

One purpose of the boost converter is to generate the 400 volt VBUS DC supply voltage on node 438. Such a 400 volt DC supply is a standard supply voltage used to achieve power factor correction. The input current being drawn from the 110 VAC source 401 is made to track the 110 VAC input sinusoidal voltage waveform of the 110 VAC wall power. The large capacitor 404 is used to filter out the 120 Hz ripple. Capacitor 404 is generally of a size of 0.5 microfarads per watt of output power.

Once voltage VP is stable and the power supply is operating in normal mode, the linear regulators 148-151 generate voltage VCORE and supply it to the processor 32 in the MCU/ADC tile. As in the example of FIG. 5, the processor once powered begins executing program code stored in RAM/FLASH. Under software control, the processor can then reconfigure the power manager tile 20 by writing to the configuration register 30 of the power manager tile across the standardized bus 24. For example, configuration register 30 is written such that the special pulse pull down mode of driver 155 is not enabled. Accordingly, the driver 155 in FIG. 6 either drives the voltage on terminal DRM 156 to the VHM voltage on terminal 124 or to ground potential on terminal GND 157. The driver 155 does not put the DRM terminal into a high impedance state after pulsing the voltage on the DRM terminal to ground potential for a short 250 nanosecond amount of time.

In the present example of FIG. 6 where the boost converter achieves power factor correction, processor 32 writes configuration information across the standardized bus to program configuration register 30 in the power manager tile such that the feedback circuit FB 140 causes amplifier 142 to rail high. This effectively disables the feedback circuit FB 140 from affecting the signal on node 136. Processor 32 uses a voltage divider involving resistors 416 and 417 and terminal 439 to monitor the VIN line voltage waveform using the ADC. Processor 32 uses a voltage divider involving resistors 418 and 419 and terminal 440 to monitor the VBUS voltage using the ADC. Based on these ADC measurements of VIN and VBUS, processor 32 adjusts the 8-bit value input of IMOD DAC 164 every ten microseconds over the 60 Hz cycle of the 110 VAC input source waveform so that the current drawn by the power supply tracks the 110 VAC sinusoidal waveform, thereby achieving an in-phase power factor corrected current draw from the 110 VAC wall power source.

There are three strings of LEDs 432, 433 and 434 that are powered from the VBUS supply at node 438 in a step-down topology. A pull-down NFET associated with each LED string is provided to conduct pulses of current through the string. When the NFET is pulsed on current flow through the associated inductor increases, whereas when the NFET is off then current flow through the inductor decreases. The on-time of the NFET is pulse width modulated into order to control the average current drawn through an associated LED string. When the NFET is on, current flows through the LED string, through the inductor, through the NFET, through the current sense resistor, and to ground conductor. In the case of LED string 426, the current sense resistor is resistor 423. A differential amplifier of the signal manager tile and the ADC is used to monitor the magnitude of this current. When the NFET is turned off, current flows through the LED string, through the inductor, and back through the diode to the VBUS conductor 438. Average current flow through the LED string is 100 mA in the present example. The pulse width modulated signal is generated by one of the timers in the MCU/ADC tile. Because there are three LED strings in the example of FIG. 6, three corresponding timers are used.

High Voltage Step Down

Figure 7:
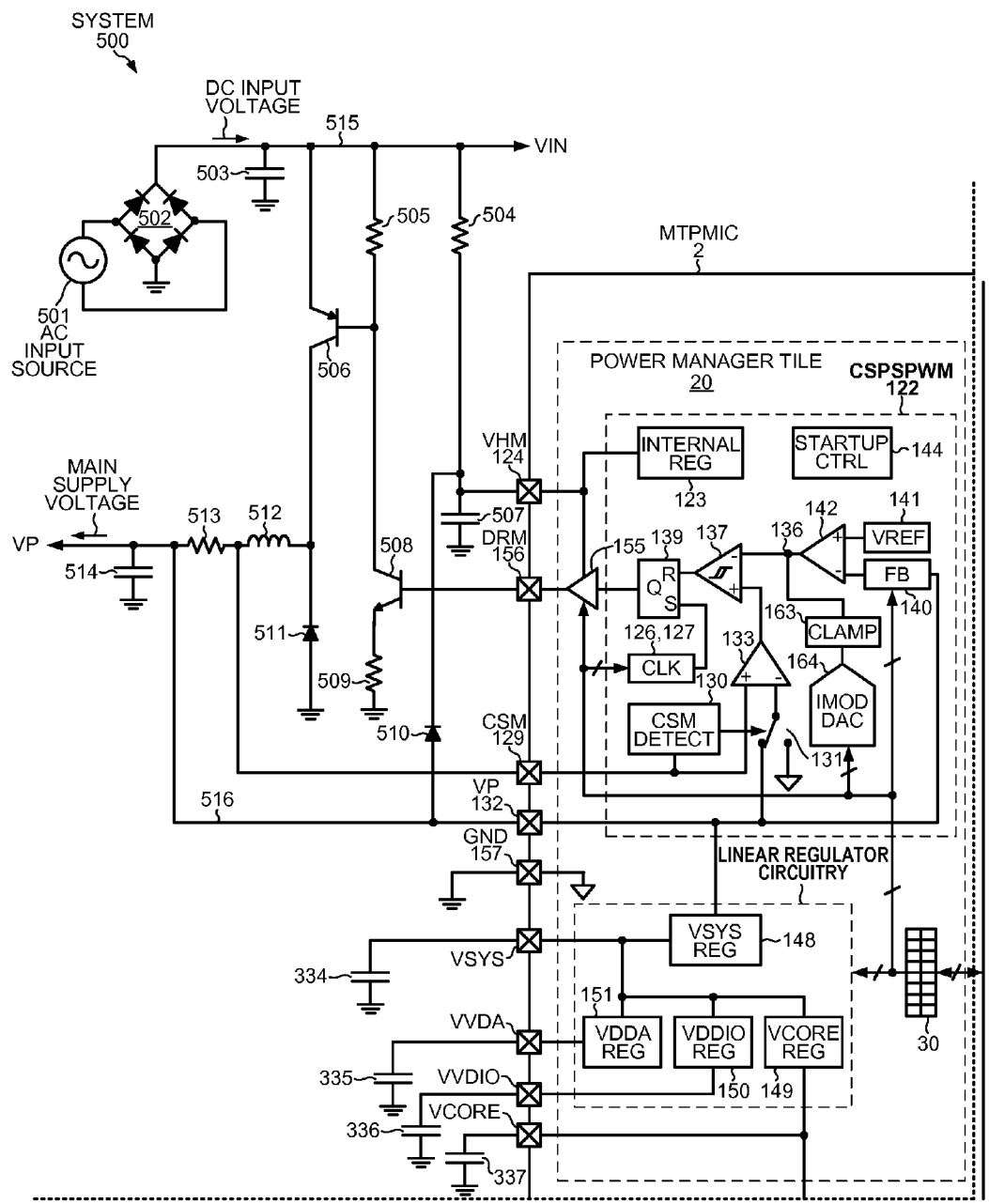
FIG. 7 is a diagram of a system 500 in which the power manager tile and external components form a high voltage step down converter power supply.

FIG. 7 is a diagram of a system 500 that includes MTPMIC 2 and external circuit components 501-514. The power manager tile 20 and the external circuitry 501-514 are configured to form a high voltage step down buck converter. The power manager tile 20 illustrated in FIG. 7 is a somewhat simplified version of the power manager tile illustrated in FIG. 4. DRM terminal 156 is used to drive an external NPN bipolar transistor 508, which in turn drives a PNP bipolar transistor 506 as a switch. PNP transistor 506 turns on and off to drive inductor 512. Resistor 513 is a current sense resistor. The 12 volt VP present on node 516 is a step down voltage generated directly from the high voltage rectified AC input voltage VIN on node 515. The rectified AC input voltage VIN on node 515 in the example of the AC input source 501 being 110 VAC wall power is 150 volts DC.

Flyback

Figure 8:
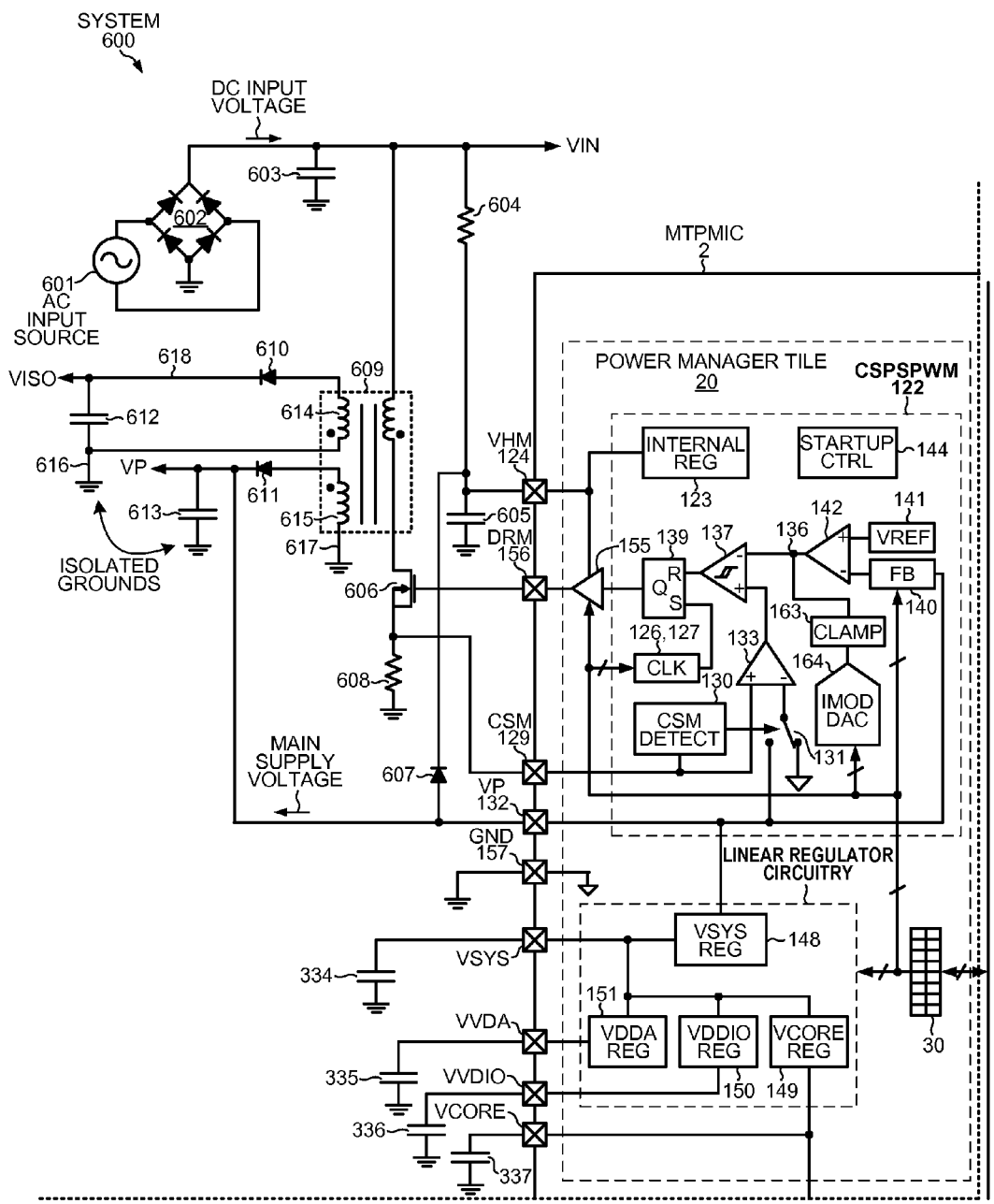
FIG. 8 is a diagram of a system 600 in which the power manager tile and external components form a flyback converter power supply.

FIG. 8 is a diagram of a system 600 that includes MTPMIC 2 and external circuit components. The power manager tile 20 and external circuit components 601-613 are configured to form a flyback converter. The CSM mode detect block 130 detects a low-side current sense configuration. An external field effect transistor 606 is turned on and off to drive the primary winding of transformer 609. In this example there are two secondary windings 614 and 615. Secondary winding 614 is used to provide an output voltage VISO whose ground is isolated from the ground of secondary winding 615. Ground conductor 616 is isolated from ground conductor 617. Secondary winding 615 is used to provide main supply voltage VP and regulation feedback to the CSPSPWM 122. If the magnitude of the sensed voltage VP is lower than desired, then the CSPSPWM 122 controls the switching of transistor 606 so that its on pulses are of longer duration. If the magnitude of the sensed voltage VP is higher than desired, then the CSPSPWM 122 controls the switching of transistor 606 so that its on pulses are of shorter duration. The internal regulator 123 and the driver 155 initially receive start up power from the VIN voltage through resistor 604 and capacitor 605, until the supply voltage VP has risen and is higher than VHM, at which point the VHM voltage is supplied by VP through diode 607. The output voltage VISO on conductor 618 is related to the main supply voltage VP by the turns ratio between secondary windings 614 and 615.

LED Drive Using Both High-Side and Low-Side FETs

Figure 9:
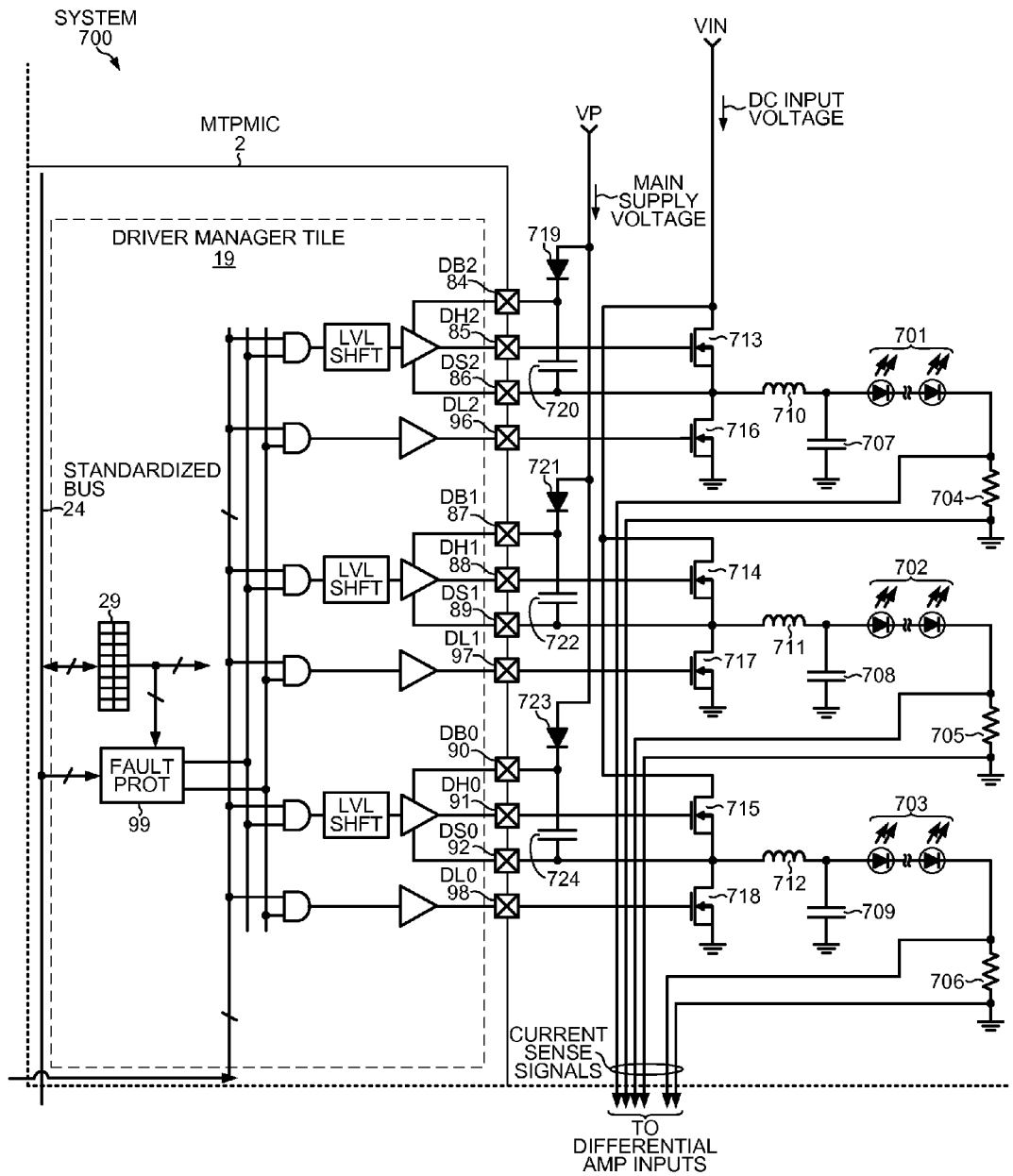
FIG. 9 is a diagram of a system 700 in which the driver manager tile is coupled to control multiple strings of LEDs.

FIG. 9 is a diagram of a system 700 that includes MTPMIC 2 and external circuit components 701-724. The driver manager tile 19 is coupled to external circuitry to drive LED strings 701-703. Each LED string in this example is driven by both a high-side external NFET as well as a low-side external NFET. For example, the high-side NFET for LED string 701 is NFET 713, and the low-side NFET for LED string 701 is NFET 716. The bootstrap driver mode of the high-side drivers is used.

Inverter H-Bridge

Figure 10:
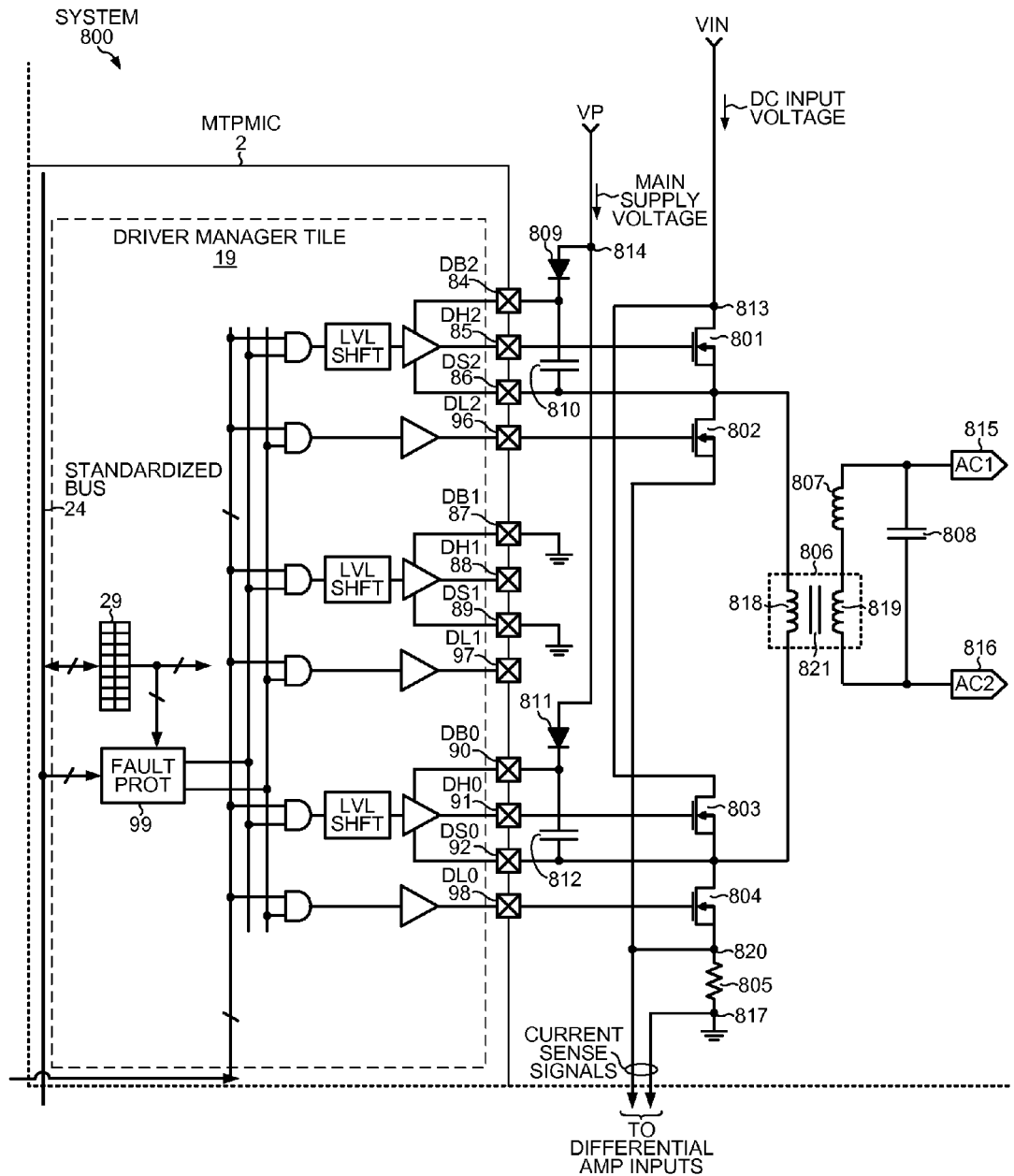
FIG. 10 is a diagram of a system 800 in which external circuitry is coupled to the driver manager tile of MTPMIC 2 to form an H-bridge inverter.

FIG. 10 is a diagram of a system 800 that includes the MTPMIC 2 and external circuit components 801-812 that together form an H-bridge inverter. A battery (not shown) is charged by some means. The battery supplies voltage VIN onto VP node 813. The power manager tile 20 is configured along with external components to form a power supply that generates the voltage VP as described above. The voltage VP on the terminal VP 132 is also present on node 814. The DC voltage VIN from the battery is converted by the inverter circuit to generate a 110 VAC 60 Hz output supply voltage between terminals 815 and 816. Current can be made to flow from node 813 downward through the primary 818 of transformer 806 and to ground node and conductor 817 by turning high-side NFET 801 on and turning low-side NFET 804 on. The magnitude of current flow is controlled by pulse width modulating these external NFETs 801 and 804. The NFETs are switched at a 20 kHz switching frequency. Current can be made to flow in the opposite direction from node 813, through conductive high-side NFET 803, upward through the primary 818 of transformer 806, through low-side NFET 802, and to ground node and conductor 817. The magnitude of this current flow in the opposite direction is also controlled by pulse width modulating the external NFETs 803 and 802. Current flow is controlled such that a sinusoidal voltage appears across the secondary winding 819. Reference numeral 821 identifies the core of the transformer 806. Inductor 807 and capacitor 808 together form a filter that filters out frequency components of the secondary signal other than the desired 60 Hz frequency component. Processor 32 determines the state of the H-bridge for control purposes by detecting the magnitude of current flow across current sense resistor 805. For example, nodes 820 and 817 can be coupled to the two input terminals of a differential amplifier of the signal manager tile. Processor 32 can monitor the magnitude of this current via ADC 64 and can adjust the driving of the H-bridge accordingly.

Wireless Charger

Figure 11:
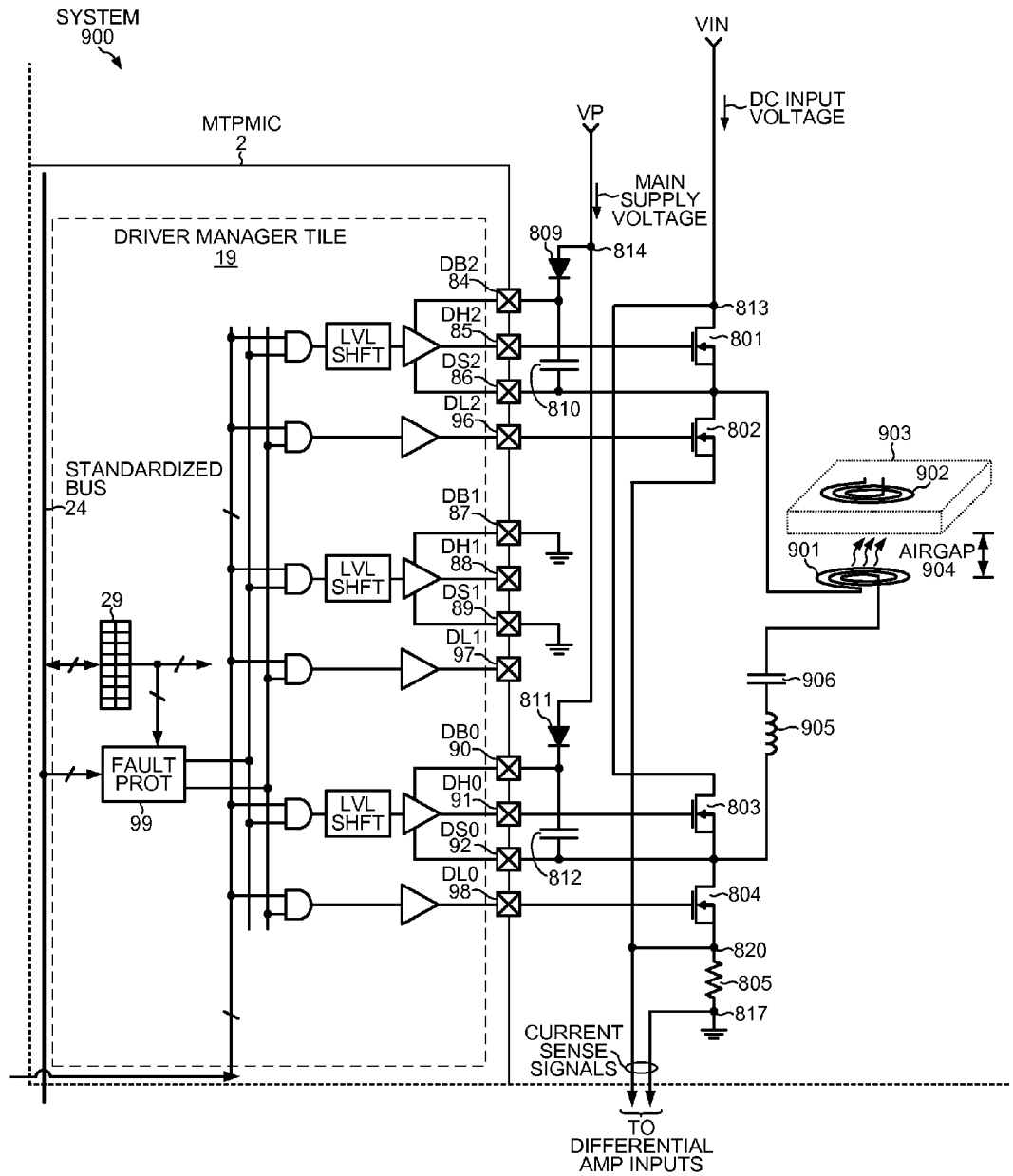
FIG. 11 is a diagram of a system 900 in which external circuitry is coupled to the driver manager tile of MTPMIC 2 to form a wireless charger.

FIG. 11 is a diagram of a system 900 involving an H-bridge charger circuit that is similar to the H-bridge charger circuit illustrated in FIG. 10. Rather than a transformer with a core 821 being used such as transformer 806 of FIG. 10, the primary winding 901 in the charger and the secondary winding 902 in another electronic device 903 are magnetically coupled but are separated by an airgap 904 in the circuit of FIG. 11. Inductor 905 and capacitor 906 set the resonant frequency of the H-bridge primary side of the circuit.

Configuration Bits

FIG. 12 is a table that sets forth the configuration register bits of the MCU/ADC tile. FIG. 13 is a table that sets forth the configuration bits of the driver manager tile. FIG. 14 is a table that sets forth the configuration bits of the power manager tile. FIG. 15 is a table that sets forth the configuration bits of the signal manager tile.

Method of Powering Up and Configuring

Figure 17:
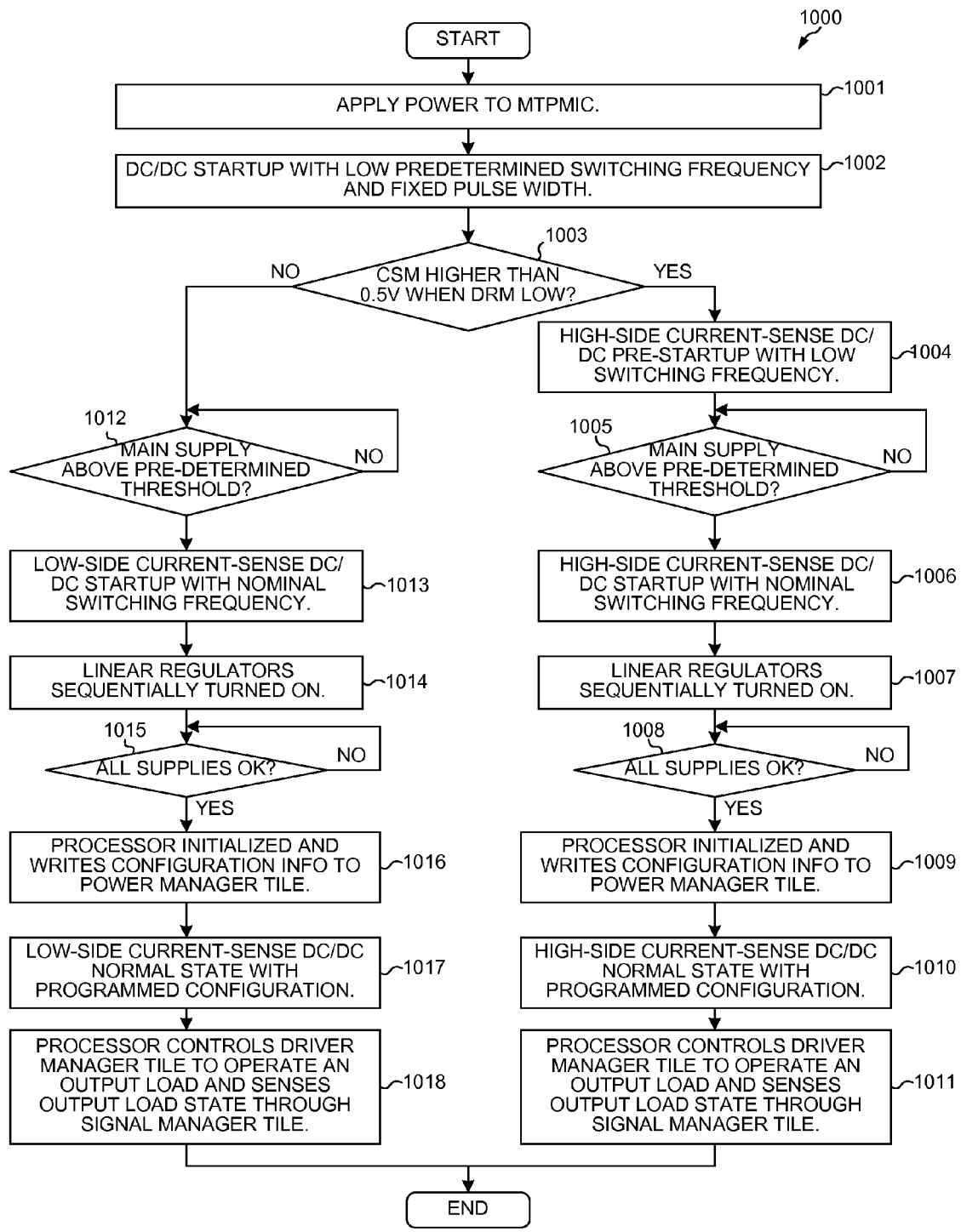
FIG. 17 is a flowchart of a method 1000 in accordance with one novel aspect.

FIG. 17 is a flowchart of a method 1000 in accordance with one novel aspect. Power is applied (step 1001) to the previously unpowered MTPMIC 2. In one example, the CSPSPWM 122 of the power manager tile 20 along with external circuitry are operable as a switching power supply circuit. The CSPSPWM 122 pulses an external main switch of the switching power supply in a startup safe mode with a fixed predetermined switching frequency and with a fixed pulse width (step 1002). The CSM mode detect block 130 determines (step 1003) if the voltage on the CSM terminal 129 is higher than 0.5 volts when the voltage on the terminal DRM 156 is being driven to a low level. If the CSM terminal 129 is determined to be higher, then the current sensing circuitry of the CSPSPWM is configured (step 1004) for high-side current sense. The main supply voltage VP rises as the switching power supply is pulsed until the main supply voltage VP is determined (step 1005) to be above a predetermined threshold voltage. The predetermined threshold voltage may be, for example, 4.3 volts. The switching frequency is then changed to a predetermined switching frequency (step 1006) for a normal operating mode of the power supply. The linear regulators are then turned on sequentially (step 1007). If all supply voltages are within proper bounds (step 1008), then the processor in the MCU/ADC tile is powered up (step 1009) from the supply voltage output by one of the linear regulators. The processor is initialized and then writes configuration information (step 1010) across the standardized bus to the configuration register of the power manager tile. The processor controls the driver manager tile (step 1011) to operate an output load, and the processor controls the signal manager tile to monitor the output load state.

At the decision of step 1003, if the CSM terminal 129 is determined to be lower than 0.5 volts when the terminal DRM is driven to a low level, then the current sensing circuitry of the CSPSPWM remains configured for low-side current sense. The main supply voltage VP rises as the switching power supply is pulsed until the main supply voltage VP is determined (step 1012) to be above a predetermined threshold voltage. The predetermined threshold voltage may be, for example, 4.3 volts. The switching frequency is then changed to a predetermined switching frequency (step 1013) for a normal operating mode of the power supply. The linear regulators are then turned on sequentially (step 1014). If all supply voltages are within proper bounds (step 1015), then the processor in the MCU/ADC tile is powered up (step 1016) from the supply voltage output by one of the linear regulators. The processor is initialized and then writes configuration information (step 1017) across the standardized bus to the configuration register of the power manager tile. The processor controls the driver manager tile (step 1018) to operate an output load, and the processor controls the signal manager tile to monitor the output load state.

Analog and Digital Feedback Signal Paths

Figure 18:
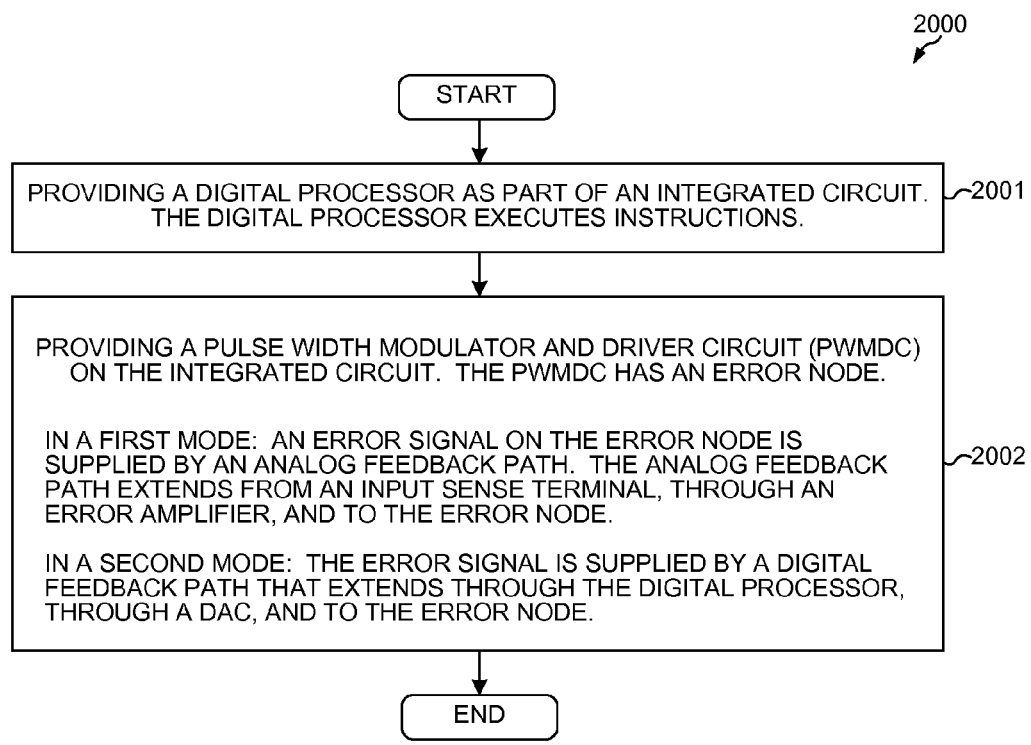
FIG. 18 is a flowchart of a method 2000 in accordance with another novel aspect.

FIG. 18 is a flowchart of a method 2000 in accordance with another novel aspect. A digital processor is provided (step 2001) as part of a MTPMIC. A pulse width modulator driver circuit (PWMDC) is provided (step 2002) such that in a first mode an error signal on an error node 136 of the PWMDC is supplied by an analog feedback signal path (in one example, the analog feedback signal path extends from input sense terminal VP 132, through error amplifier 142, and to error node 136), whereas in a second mode the error signal on the error node 136 is supplied by a digital feedback signal path (in one example, the digital feedback signal path extends through digital processor 32, through a Digital-to-Analog Converter (DAC) 164, and to error node 136). The PWMDC includes configurable the switching power supply pulse width modulator 122 and the driver circuit 155. In this discussion, a packaged integrated circuit can loosely be referred to as being an integrated circuit and a package terminal can loosely be referred to as being a terminal of such an integrated circuit.

In one example of the method 2000, the PWMDC drives a control signal on the driver output terminal DRM 156 to a first voltage level in response to an edge of a clock signal. The clock signal is the clock signal output by oscillator 126. In the first mode, the PWMDC stops the on pulse by driving the control signal on the driver output terminal DRM 156 to a second voltage level when a first signal on the terminal CSM 129 has a predetermined relationship with respect to the error signal, where the error signal is derived from a second signal on a second sense input terminal VP 132. In the second mode, the PWMDC stops the on pulse by driving the control signal on the driver output terminal DRM 156 to the second voltage level when the first signal on the first sense input terminal CSM 129 has a predetermined relationship with respect to a multi-bit digital value supplied by the digital processor to the DAC 164.

The PWMDC of the integrated circuit, along with other external components, forms a switching power supply. The switching power supply generates supply voltage VP that is present on the second sense input terminal VP 132. Second linear regulator circuitry 148-151 receives the supply voltage VP generated by the power supply and outputs a supply voltage VCORE that powers the digital processor. The supply voltage output by the switching power supply also powers the high-side and low-side driver circuitry. The PWMDC circuitry, on the other hand, is not powered (directly or indirectly) from the power supply, but rather a second internal regulator 123 regulates a voltage present on another terminal VHM 124. The regulated supply voltage output by this second internal regulator is then used to power the PWMDC. Terminal VHM 124 may, for example, be coupled to receive a supply voltage from an external battery.

The digital processor can write to configuration bits 167-170 and thereby configure and control the PWMDC. As described above in connection with DC clamp circuit 163, the digital processor can control whether the PWMDC operates in the first mode or in the second mode. Although certain specific embodiments are described above for instructional purposes, the teachings of this patent document have general applicability and are not limited to the specific embodiments described above. Although a clamping circuit is described above as one way of performing the function of multiplexing a selected one of either an analog feedback signal path or a digital feedback signal path onto an error node of a PWM, other suitable circuits can be employed to perform the function including, for example, an analog multiplexer or multiple error nodes. Accordingly, various modifications, adaptations, and combinations of various features of the described embodiments can be practiced without departing from the scope of the invention as set forth in the claims.

What is claimed is:

1. An integrated circuit comprising:
a digital processor that executes instructions;
a first sense input terminal;
a second sense input terminal;
a driver output terminal; and
a pulse width modulator and driver circuit (PWMDC) that starts an on pulse by driving a control signal on the driver output terminal to a first voltage level in response to an edge of a clock signal, and in a first mode stops the on pulse by driving the control signal on the driver output terminal to a second voltage level when a first signal on the first sense input terminal has a predetermined relationship with respect to an error signal derived from a second signal on the second sense input terminal, and in a second mode stops the on pulse by driving the control signal on the driver output terminal to the second voltage level when the first signal on the first sense input terminal has a predetermined relationship with respect to a multi-bit digital value received from the digital processor.

2. The integrated circuit of claim 1, wherein in the second mode the digital processor operates as part of a digital feedback signal path, and wherein the digital feedback path extends through an Analog-to-Digital Converter (ADC), through the digital processor, and to the PWMDC.

3. The integrated circuit of claim 2, wherein in the second mode the digital processor operates as part of the digital feedback signal path by repeatedly changing the multi-bit digital value supplied to the PWMDC.

4. The integrated circuit of claim 1, wherein the digital processor controls whether the PWMDC operates in the first mode or in the second mode.

5. The integrated circuit of claim 1, wherein the PWMDC includes a comparator, and wherein a first analog signal path extends from the first sense input terminal and to a first input lead of the comparator.

6. The integrated circuit of claim 5, wherein the PWMDC includes an error node, and wherein in the first mode a second analog signal path extends from the second sense input terminal, through an error amplifier of the PWMDC, and to the error node.

7. The integrated circuit of claim 6, wherein the error node is a second input lead of the comparator.

8. The integrated circuit of claim 1, wherein the PWMDC includes an error node, and wherein in the second mode the multi-bit digital value received from the digital processor results in a voltage on the error node being clamped to a voltage that corresponds to the multi-bit digital value.

9. The integrated circuit of claim 6, wherein the second analog signal path has a gain, and wherein the gain of the second analog signal feedback path is programmable by the digital processor.

10. The integrated circuit of claim 1, wherein the PWMDC includes an on-chip oscillator that has no off-chip components, and wherein the on-chip oscillator outputs the clock signal.

11. The integrated circuit of claim 1, further comprising:
a third input terminal; and
linear regulator circuitry that converts a voltage present on the third input terminal into a regulated supply voltage, and wherein the regulated supply voltage powers the PWMDC but does not power the digital processor.

12. The integrated circuit of claim 1, further comprising:
an Analog-to-Digital Converter (ADC), wherein in the second mode the digital processor receives information from the ADC and based at least in part on the information changes the multi-bit digital value.

13. The integrated circuit of claim 1, wherein the PWMDC is adapted to be a part of a switching power supply, wherein the switching power supply includes the PWMDC and components external to the integrated circuit, and wherein the switching power supply generates a supply voltage present on the second sense terminal.

14. The integrated circuit of claim 1, wherein a control electrode of a power transistor is coupled to the driver output terminal, wherein the power transistor is external to the integrated circuit, and wherein the on pulse results in the power transistor being pulsed on.

15. The integrated circuit of claim 1, further comprising:
high-side driver and low-side driver circuitry, wherein the PWMDC is adapted to be a part of a switching power supply, wherein the switching power supply includes the PWMDC and components external to the integrated circuit, and wherein at least some of the high-side driver and low-side driver circuitry is powered by the switching power supply.

16. The integrated circuit of claim 15, further comprising:
linear regulator circuitry that receives a voltage from the switching power supply and that supplies a regulated supply voltage to the digital processor.

17. A method comprising:
providing a digital processor as part of an integrated circuit, wherein the digital processor executes instructions; and
providing a pulse width modulator and driver circuit (PWMDC) on the integrated circuit, wherein in a first mode an error signal on an error node within the PWMDC is supplied by an analog feedback signal path, wherein the analog feedback signal path extends from an input sense terminal of the integrated circuit and through an error amplifier of the PWMDC, and to the error node, and wherein in a second mode the error signal on the error node within the PWMDC is supplied by a digital feedback signal path, wherein the digital feedback signal path extends through the digital processor and through a Digital-to-Analog Converter (DAC) and to the error node.

18. The method of claim 17, further comprising:
providing high-side driver and low-side driver circuitry on the integrated circuit, wherein the PWMDC is adapted to be a part of a switching power supply, wherein the switching power supply includes the PWMDC and components external to the integrated circuit, and wherein at least some of the high-side driver and low-side driver circuitry is powered by the switching power supply.

19. The method of claim 18, further comprising:
providing linear regulator circuitry on the integrated circuit, wherein the linear regulator circuitry converts a voltage present on a terminal of the integrated circuit into a regulated supply voltage, and wherein the regulated supply voltage powers the PWMDC but does not power the high-side drive and low-side driver circuitry and does not power the digital processor.

20. An integrated circuit comprising:
a digital processor adapted to execute instructions;
a first terminal;
a second terminal;
means for pulse width modulating a switching power supply so as to generate a supply voltage, wherein the means is for starting an on pulse by driving a control signal on the first terminal to a first voltage level, and in a first mode is for stopping the on pulse by driving the control signal to a second voltage level based at least in part on an analog feedback signal received onto the integrated circuit via the second terminal, and in a second mode is for stopping the on pulse by driving the control signal to the second voltage level based at least in part on a digital feedback signal received from the digital processor, wherein the switching power supply includes the means and also includes components external to the integrated circuit; and
driver circuitry, wherein at least some of the driver circuitry is powered by the supply voltage generated by the switching power supply, and wherein the driver circuitry includes at least one driver taken from the group consisting of: a high-side driver, a low-side driver, and an open-drain driver.

21. The integrated circuit of claim 20, wherein the means includes an error node, wherein in the first mode an analog signal path extends from the second terminal, through an error amplifier, and to the error node, and wherein in the second mode the digital feedback signal is converted into a corresponding analog signal and the corresponding analog signal is supplied onto the error node by clamping a voltage on the error node to a voltage that corresponds to the digital feedback signal.

22. The integrated circuit of claim 20, wherein the means includes a Digital-to-Analog Converter (DAC), and wherein the digital feedback signal is a multi-bit digital signal received by the DAC.

23. The integrated circuit of claim 20, further comprising:
a third terminal; and
linear regulator circuitry that converts a voltage present on the third terminal into a regulated supply voltage, and wherein the regulated supply voltage at least in part powers the means but does not power the digital processor.

24. The integrated circuit of claim 20, wherein the digital processor controls whether the means operates in the first mode or in the second mode.

* * * * *